(12) United States Patent
Laven et al.

(10) Patent No.: US 10,153,275 B2
(45) Date of Patent: Dec. 11, 2018

(54) METHOD OF OPERATING AN IGBT HAVING SWITCHABLE AND NON-SWITCHABLE DIODE CELLS

(71) Applicant: Infineon Technologies AG, Neubiberg (DE)

(72) Inventors: Johannes Georg Laven, Taufkirchen (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/906,859

(22) Filed: Feb. 27, 2018

(65) Prior Publication Data

US 2018/0190650 A1    Jul. 5, 2018

Related U.S. Application Data

(62) Division of application No. 15/209,473, filed on Jul. 13, 2016, now Pat. No. 9,941,274.

(30) Foreign Application Priority Data

Jul. 14, 2015  (DE) .................. 10 2015 111 371

(51) Int. Cl.
*H01L 27/06* (2006.01)
*H01L 29/739* (2006.01)
(Continued)

(52) U.S. Cl.
CPC ...... *H01L 27/0664* (2013.01); *H01L 27/0727* (2013.01); *H01L 29/0834* (2013.01); *H01L 29/7397* (2013.01); *H01L 29/8613* (2013.01)

(58) Field of Classification Search
CPC ............ H01L 27/0664; H01L 29/0834; H01L 29/7397; H01L 29/8613
See application file for complete search history.

(56) References Cited

U.S. PATENT DOCUMENTS

2017/0047322 A1    2/2017 Yoshida et al.
2017/0338815 A1*  11/2017 Laven .................. H03K 17/567

FOREIGN PATENT DOCUMENTS

DE    102014119278 A1    6/2015
JP    2008192737 A       8/2008
(Continued)

*Primary Examiner* — Jung Kim
(74) *Attorney, Agent, or Firm* — Murphy, Bilak & Homiller, PLLC

(57) ABSTRACT

A method of operating an IGBT is described. The IGBT has gate, emitter and collector terminals, and IGBT cells, switchable diode cells, and non-switchable diode cells integrated in a semiconductor substrate, wherein each of the IGBT cells and switchable diode cells includes an operable switchable channel region. The IGBT is operated in a reverse conductive mode in which the IGBT cells are in a non-conductive mode and the switchable diode cells and the non-switchable diode cells are in a bipolar mode. The IGBT is brought from the reverse conductive mode to a transit mode in which at least some of the non-switchable diode cells are still in the bipolar mode, the IGBT cells are in the non-conductive mode, and the switchable diode cells are in a unipolar mode, by applying a gate voltage having an absolute value larger than a gate threshold voltage to the gate terminal.

20 Claims, 18 Drawing Sheets

(51) Int. Cl.
   *H01L 29/08*     (2006.01)
   *H01L 27/07*     (2006.01)
   *H01L 29/861*    (2006.01)

(56)        References Cited

FOREIGN PATENT DOCUMENTS

JP    2012033897 A    2/2012
JP    2015106695 A    6/2015
WO    2015068203 A1   5/2015
WO    2015093038 A1   6/2015

* cited by examiner

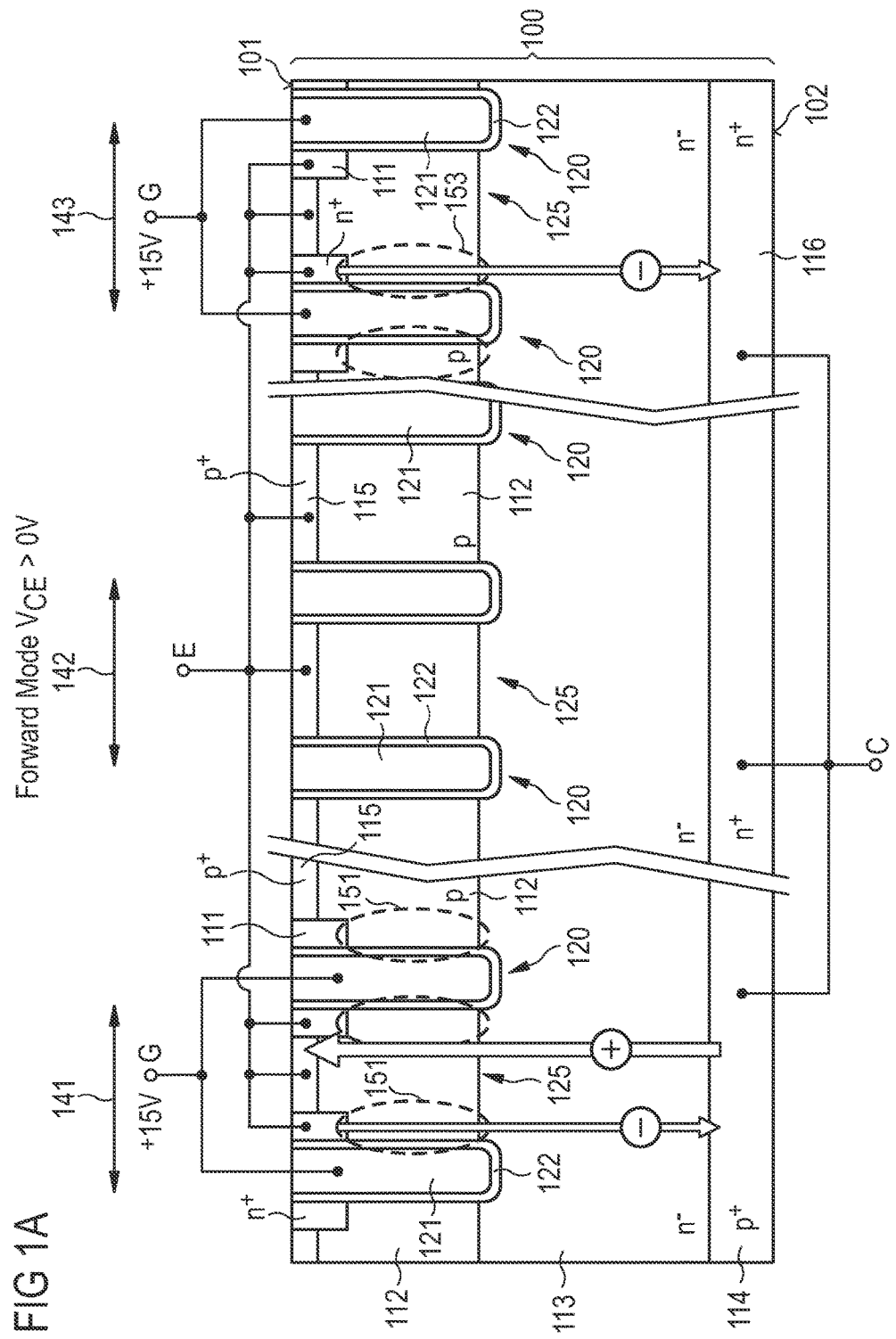

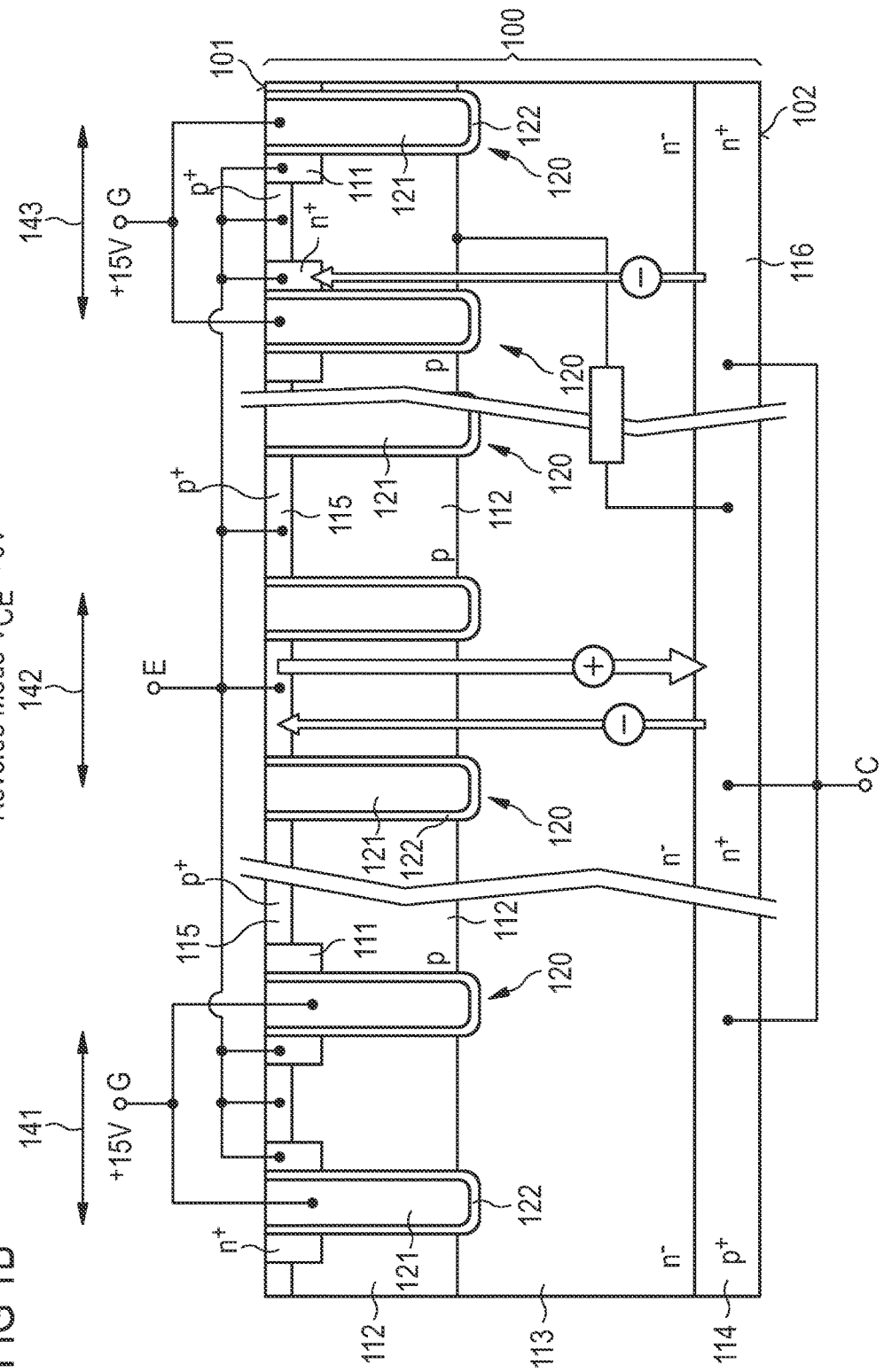

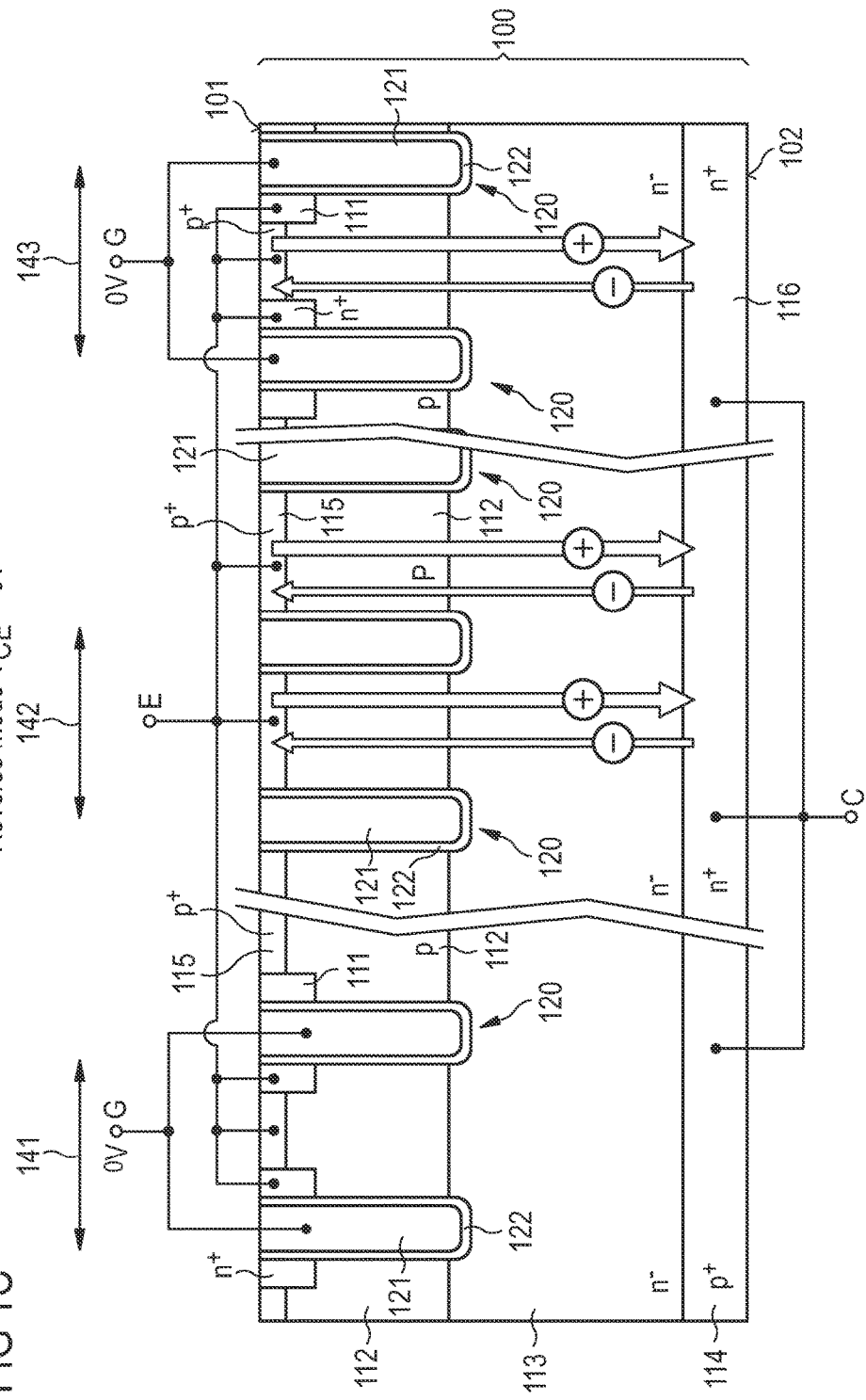

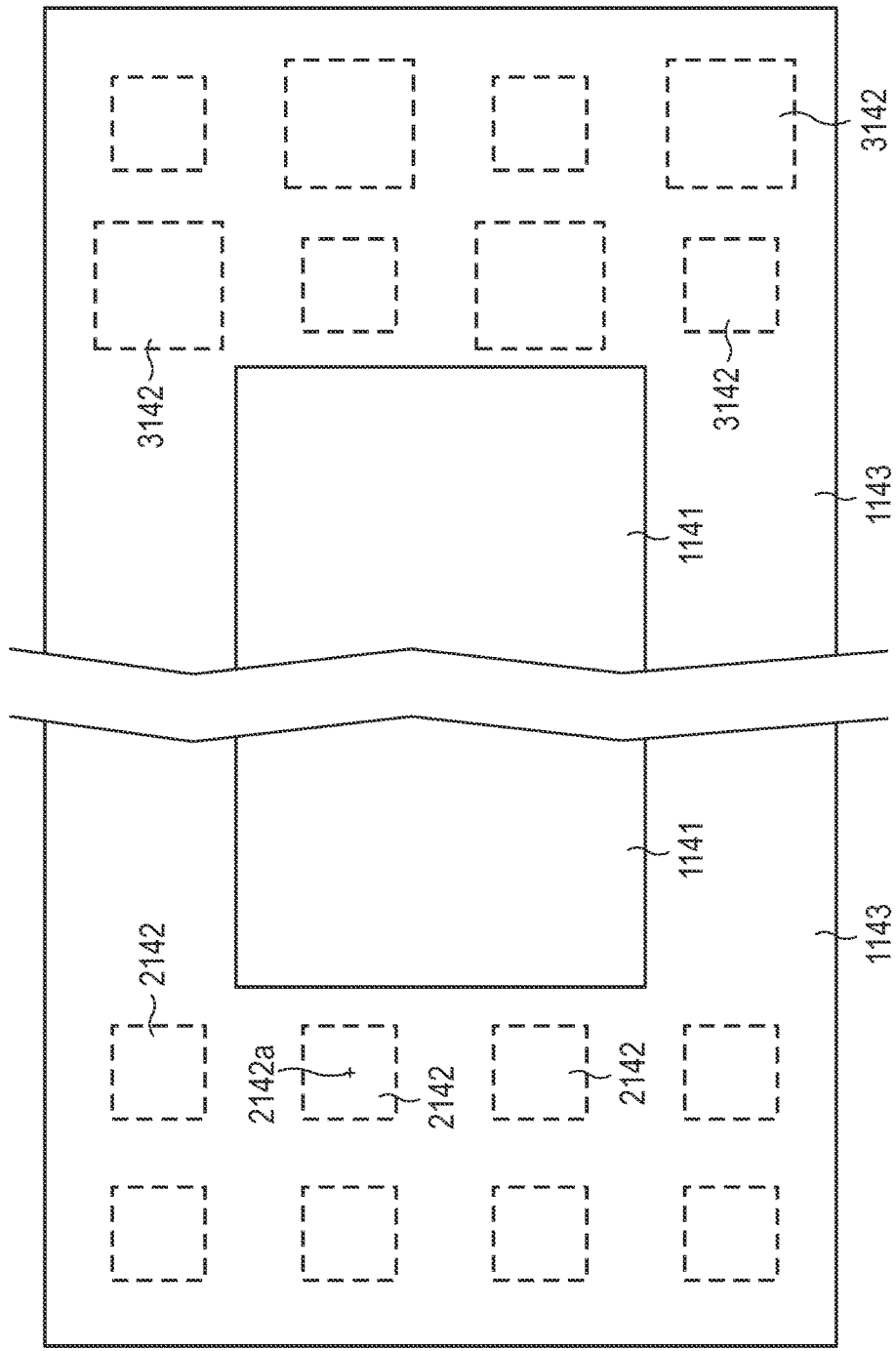

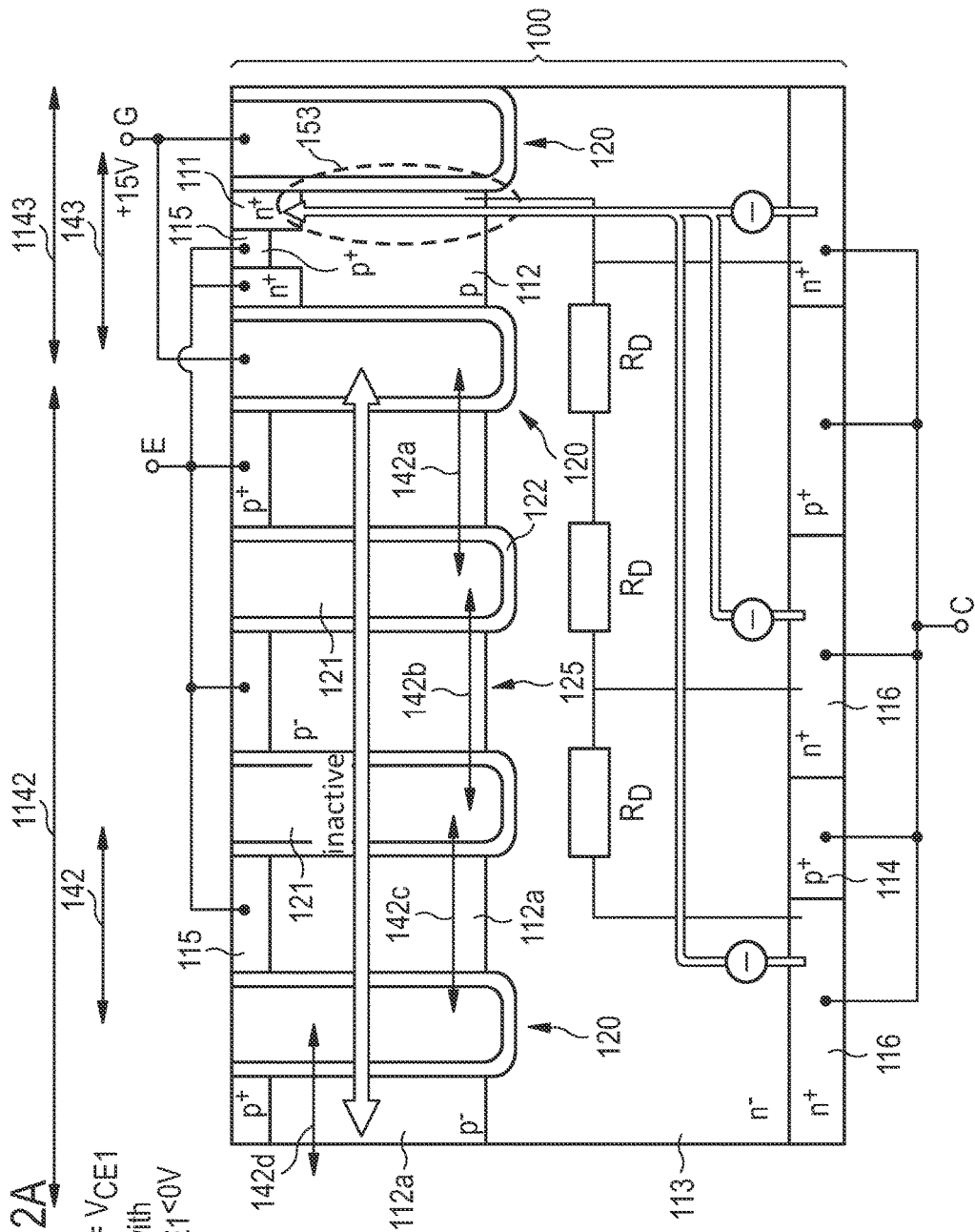

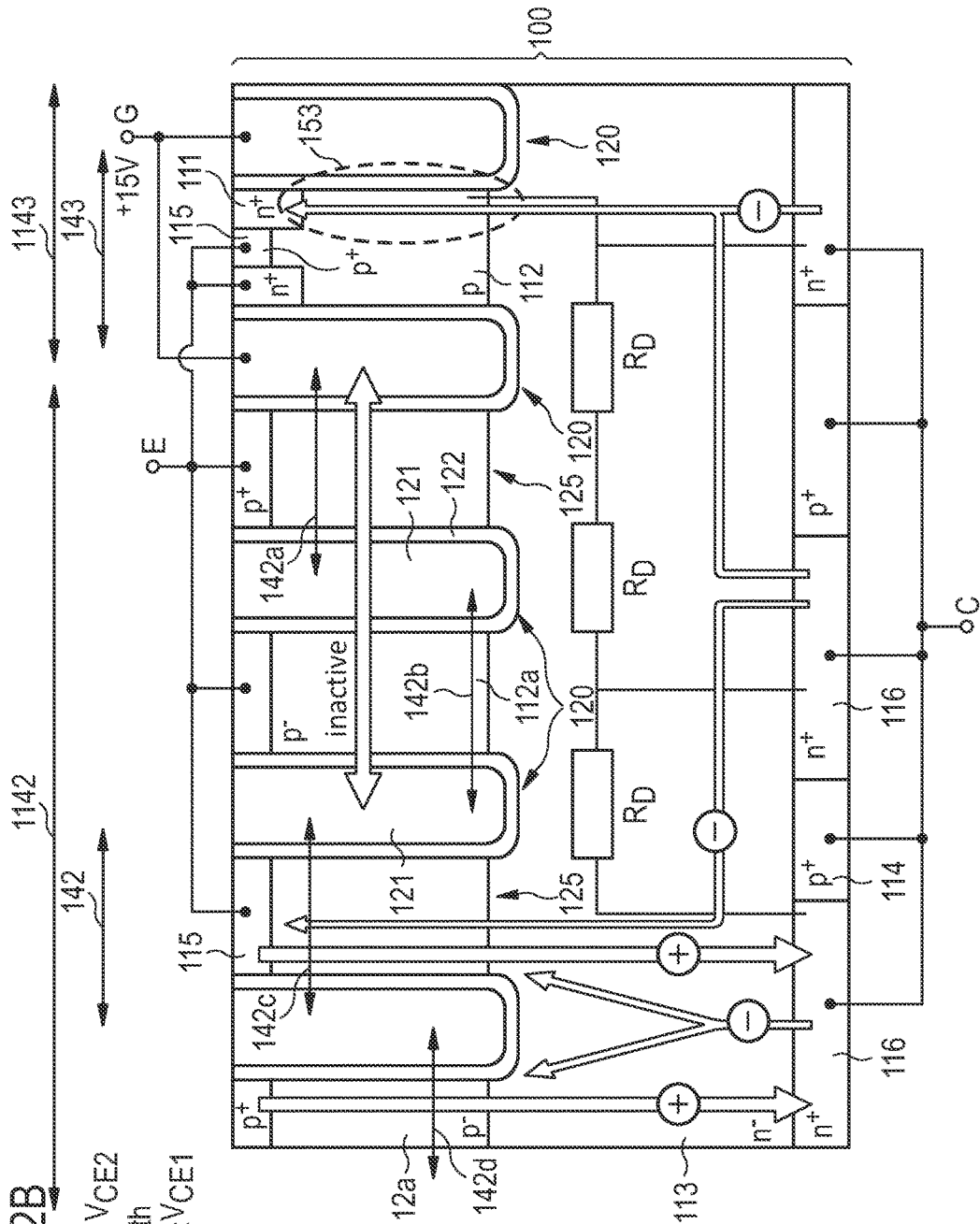

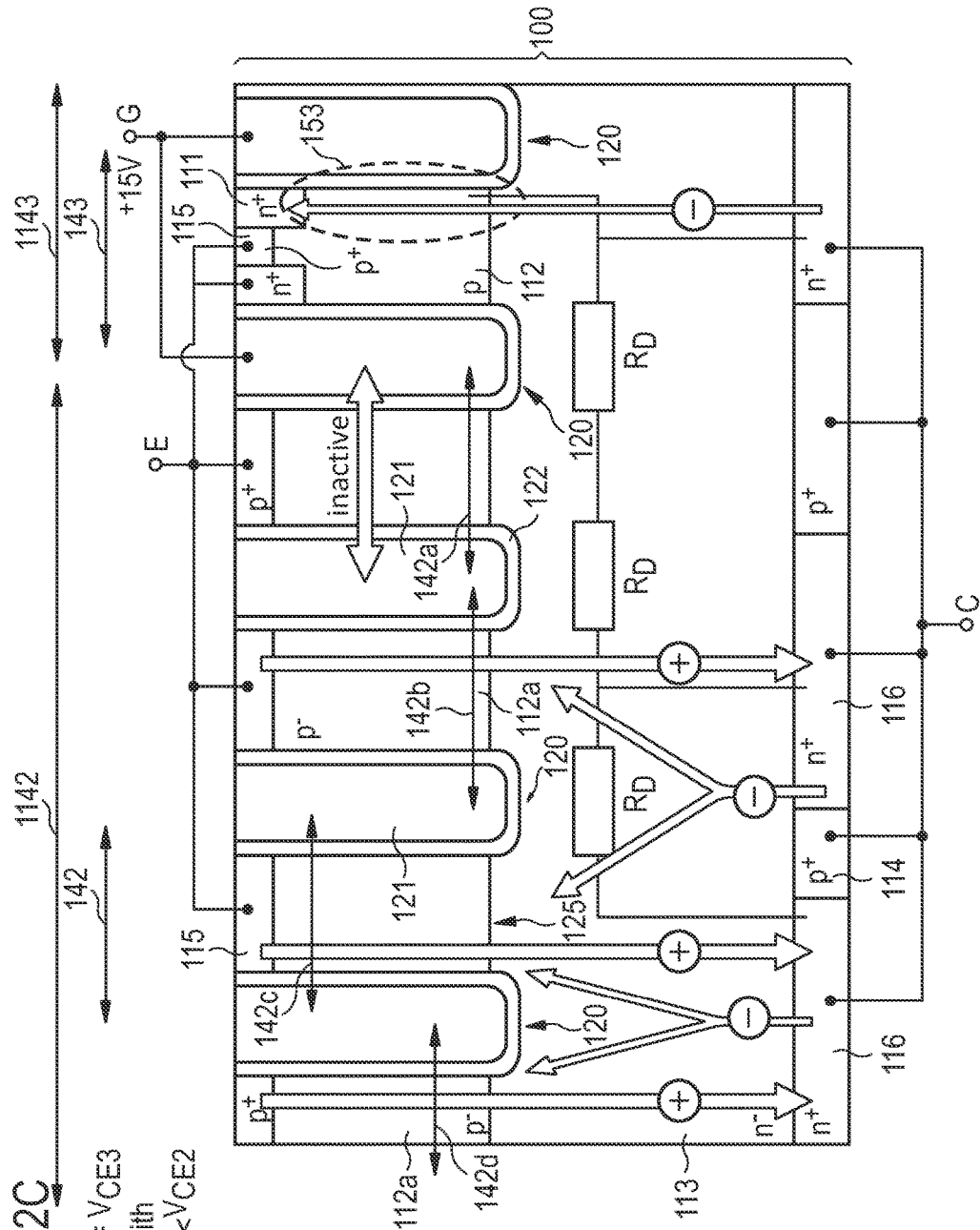

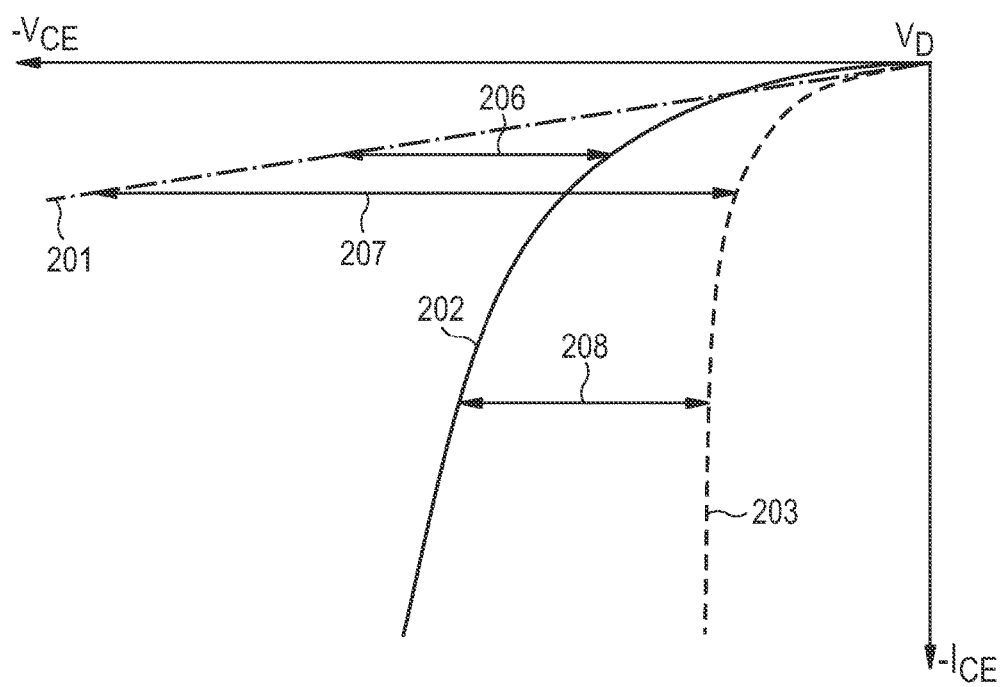

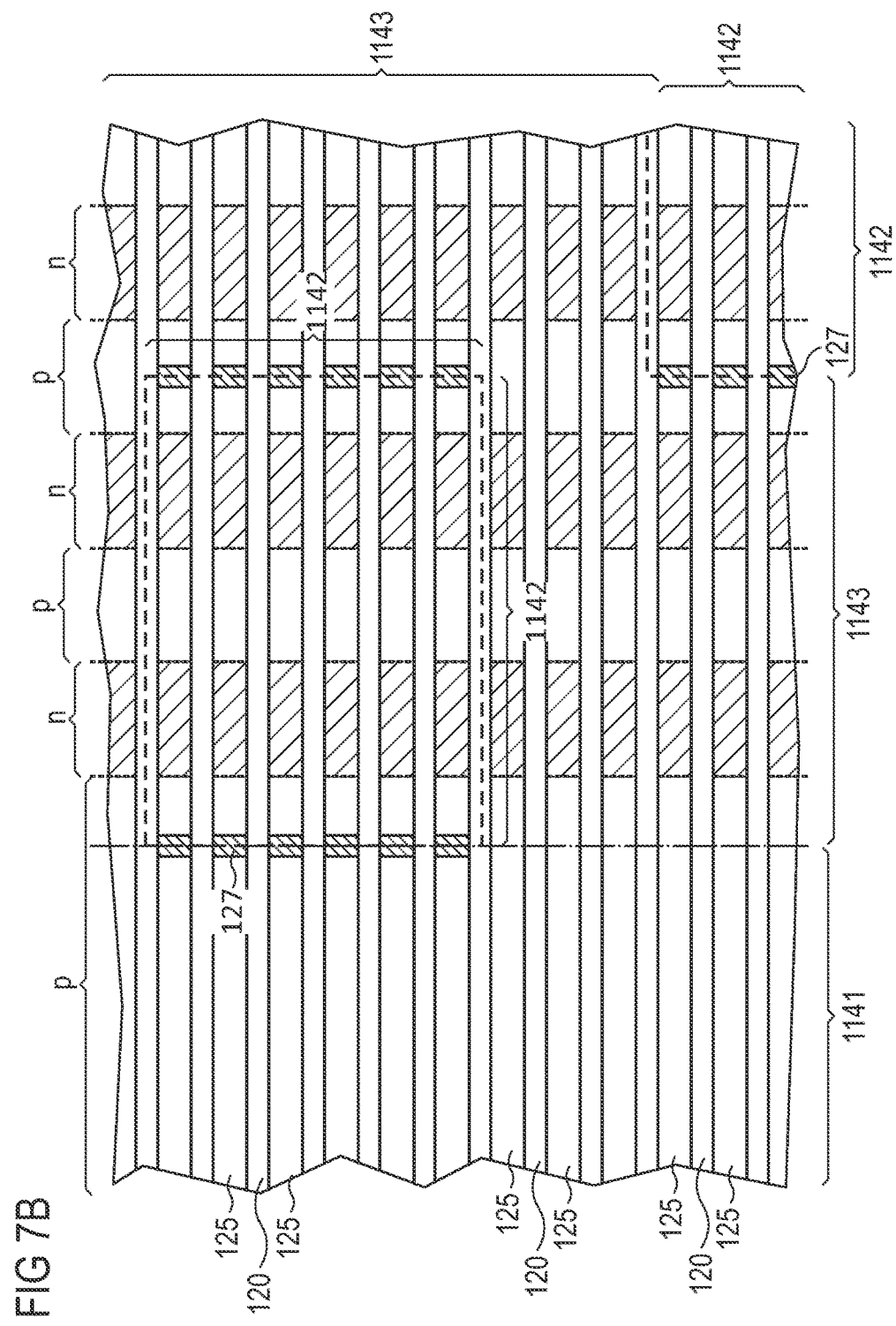

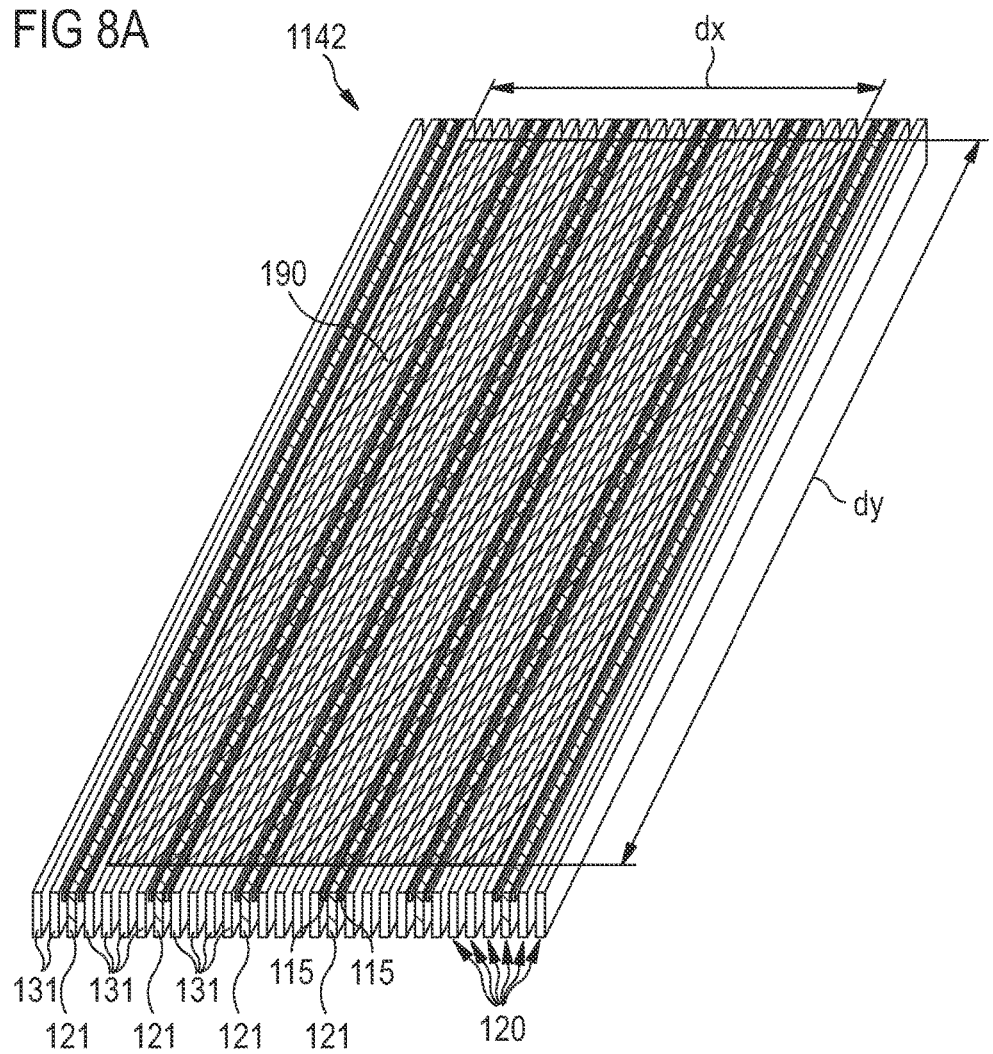

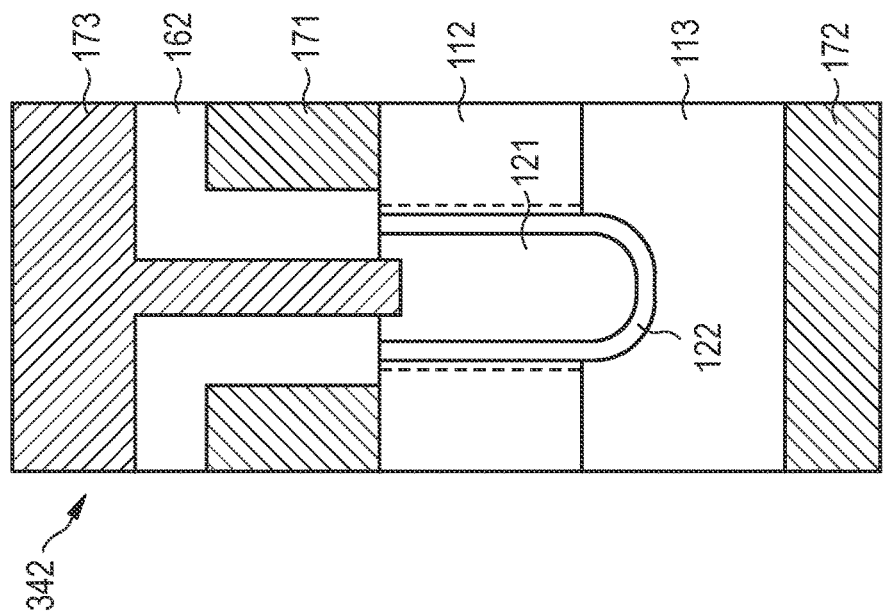
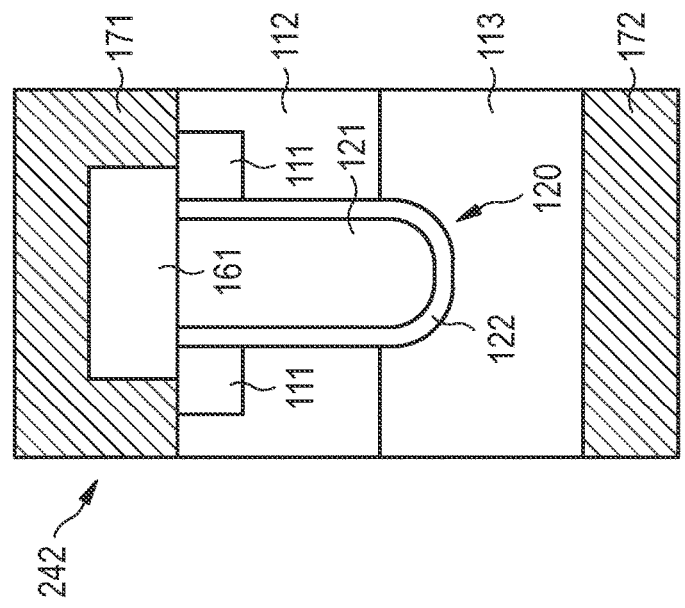

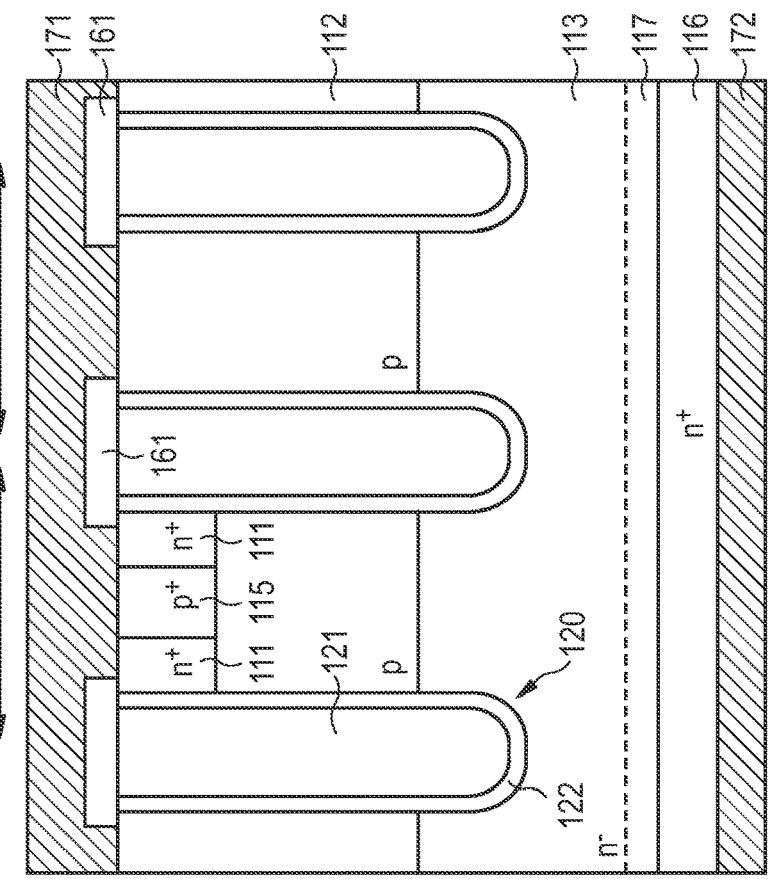
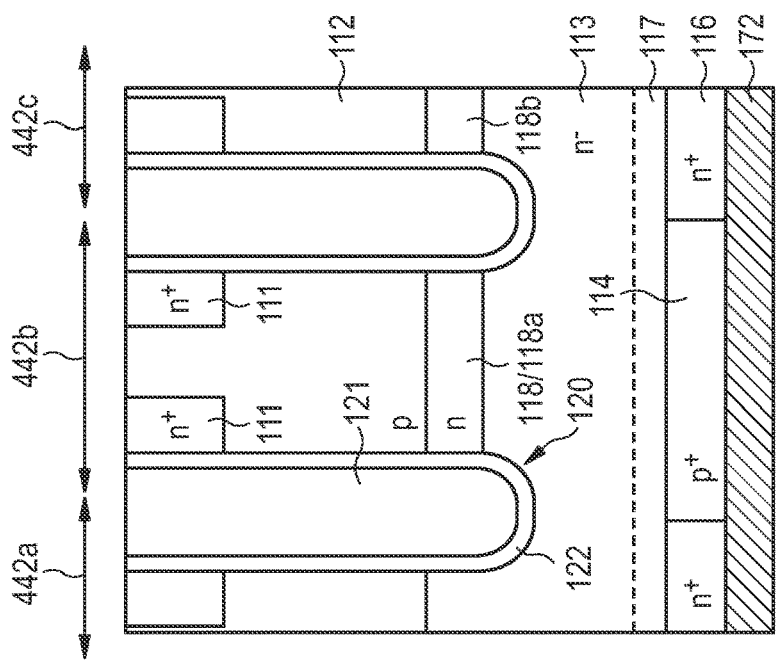

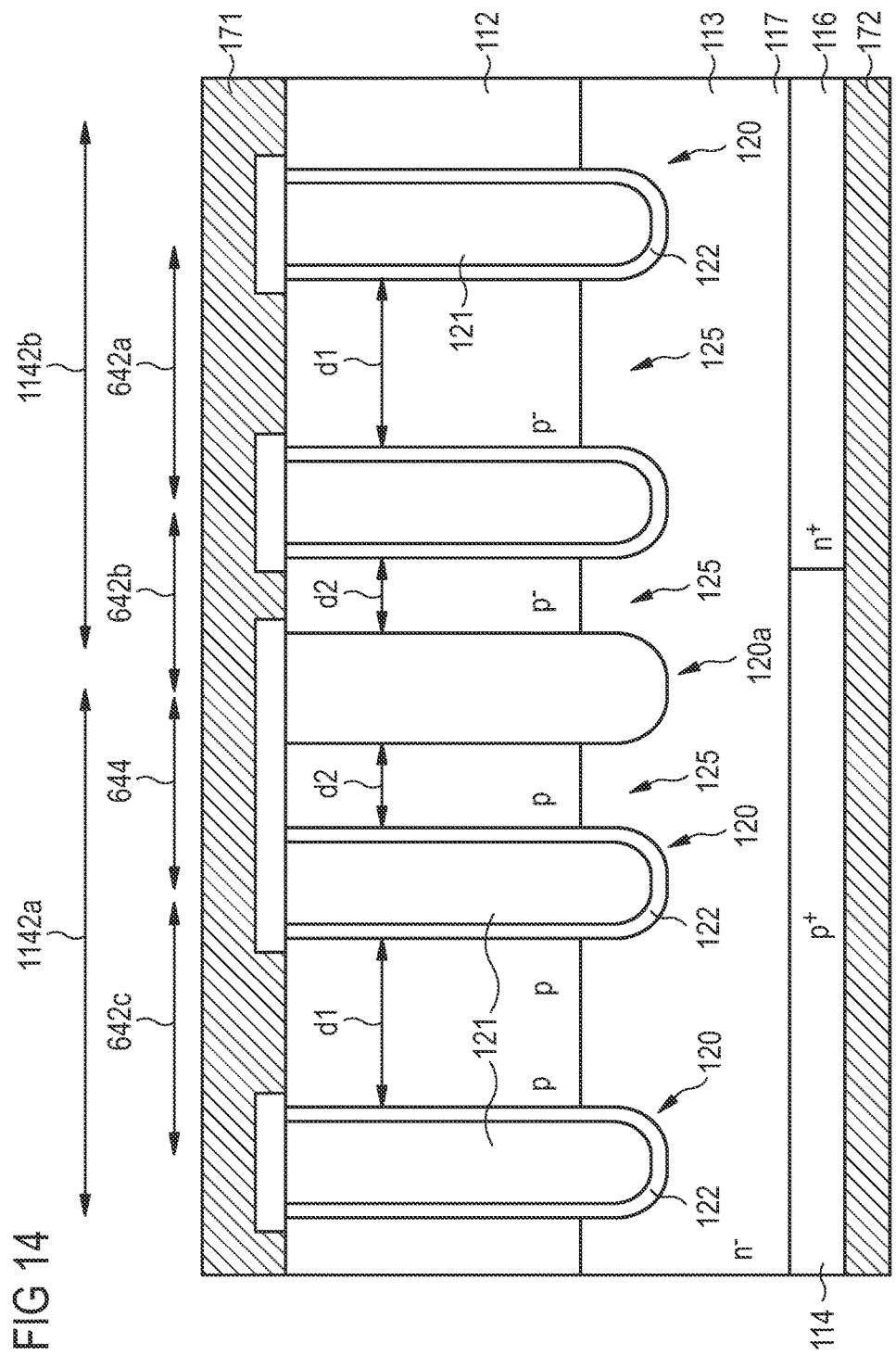

METHOD OF OPERATING AN IGBT HAVING SWITCHABLE AND NON-SWITCHABLE DIODE CELLS

TECHNICAL FIELD

Embodiments described herein relate to semiconductor devices having an IGBT region, a switchable diode region and a non-switchable diode region.

BACKGROUND

IGBTs (Insulated Gate Bipolar Transistors) are very versatile power semiconductor devices since they have a very low on-state resistance, often abbreviated as $R_{ON}$. As IGBTs are often used for controlling inductive loads, power modules which include IGBTs as active switches typically include so-called free-wheeling diodes which allow a current flow in reverse direction. The reverse current may be driven by the inductive load during switching.

An IGBT is a bipolar device. The low $R_{ON}$ is the result of a high charge carrier concentration, typically holes, which are emitted from the typically p-doped emitter into the drift region during forward conductive mode of the IGBT. The drift region is then flooded with excess charge carriers. When the IGBT is brought into the blocking mode, the excess charge carriers need to be removed from the drift region before the drift region is capable of carrying the blocking voltage.

Modern IGBTs may have integrated free-wheeling diodes so that no external free-wheeling diode is needed. IGBTs with integrated free-wheeling diodes are also referred to as RC-IGBTs (Reverse Current—Insulated Gate Bipolar Transistor) as the IGBT is adapted to carry also a reverse current.

It is desired that the IGBT can also carry a reverse current when a gate voltage is applied to the gate electrodes of the IGBT cells. Activated IGBT cells, i.e. IGBT cells to which the gate voltage is applied, may however affect the bipolar operation in reverse current mode.

There is therefore a desire to maintain or even improve device performance specifications, while allowing robust reverse current characteristic.

SUMMARY

According to an embodiment, a semiconductor device includes a semiconductor substrate, a front metallization, a back metallization, and a plurality of IGBT cells integrated in the semiconductor substrate and forming at least one IGBT cell region, wherein each of the IGBT cells includes an operable switchable channel region for providing an ohmic connection between the front metallization and a drift region of the semiconductor substrate. The semiconductor device can further include a plurality of switchable diode cells integrated in the semiconductor substrate and forming at least one switchable free-wheeling diode region, wherein each of the switchable diode cells includes a pn-junction and an operable switchable channel region for short-circuiting the pn-junction of the respective switchable diode cell and for providing an ohmic connection through the respective switchable diode cell between the front metallization and the back metallization. The semiconductor device can further include a plurality of non-switchable diode cells integrated in the semiconductor substrate and forming at least one non-switchable free-wheeling diode region, each of the non-switchable diode cells comprising a pn-junction, wherein the non-switchable free-wheeling diode region does not include any operable switchable channel region.

According to an embodiment, a semiconductor device includes a semiconductor substrate, a front metallization, a back metallization, and at least one IGBT cell region integrated in the semiconductor substrate and having an operable switchable channel region for providing an ohmic connection between the front metallization and a drift region of the semiconductor substrate. The semiconductor device can further include at least one switchable free-wheeling diode region integrated in the semiconductor substrate and having a pn-junction and an operable switchable channel region for short-circuiting the pn-junction and for providing an ohmic connection through the switchable free-wheeling diode region between the front metallization and the back metallization. The semiconductor device can further include at least one non-switchable free-wheeling diode region integrated in the semiconductor substrate and having a pn-junction, wherein the non-switchable free-wheeling diode region has a centroid when seen in normal projection onto the first surface, wherein the centroid of the non-switchable free-wheeling diode region is spaced from the nearest operable switchable channel region by a distance of at least 30 µm or 40 µm, or a specific distance per conductivity between 300 µm*Ohm*cm to 30000 µm*Ohm*cm, particularly between 1000 µm*Ohm*cm to 10000 µm*Ohm*cm.

According to an embodiment, a semiconductor device includes a semiconductor substrate, a front metallization on a first side of the semiconductor substrate, a back metallization on a second side of the semiconductor substrate, and a plurality of IGBT cells integrated in the semiconductor substrate and forming at least one IGBT cell region, wherein each of the IGBT cells has an operable switchable channel region for providing an ohmic connection between the front metallization and a drift region of the semiconductor substrate. The semiconductor device can further include a plurality of switchable diode cells integrated in the semiconductor substrate and forming at least one switchable free-wheeling diode region, wherein each of the switchable diode cells has a pn-junction and an operable switchable channel region for short-circuiting the pn-junction of the respective switchable diode cell and for providing an ohmic connection through the respective switchable diode cell between the front metallization and the back metallization. The semiconductor device can further include a plurality of non-switchable diode cells integrated in the semiconductor substrate and forming at least one non-switchable free-wheeling diode region, wherein each of the non-switchable diode cells has a pn-junction, wherein no operable switchable channel region is arranged between any two the non-switchable diode cells of the plurality of the non-switchable diode cells of the non-switchable free-wheeling diode region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 1A to 1C illustrate a cross-sectional view of a semiconductor device having a IGBT cell region, a switchable diode region and a non-switchable diode region, according to an embodiment described herein, in different operating modes;

FIG. 1D illustrates a top view of a semiconductor device according to an embodiment;

FIGS. 2A to 2C illustrate a cross-sectional view of a semiconductor device having a switchable diode region and a non-switchable diode region, according to an embodiment described herein, in reverse conductive mode at different emitter-collector voltages;

FIG. 3 illustrates diode characteristics of switchable and non-switchable diode cells under different operating conditions in reverse conductive mode;

FIG. 7B illustrates an enlarged section of the plane view of FIG. 7A;

FIG. 8A illustrates a 3-dimensional illustration of a section of a semiconductor device, according to an embodiment described herein;

FIG. 10 illustrates a non-switchable diode according to an embodiment;

FIG. 11 illustrates a non-switchable diode according to an embodiment;

FIG. 12 illustrates a non-switchable diode according to an embodiment;

FIG. 13 illustrates a non-switchable diode according to an embodiment; and

FIG. 14 illustrates a non-switchable diode according to an embodiment.

DETAILED DESCRIPTION

Figure 4:
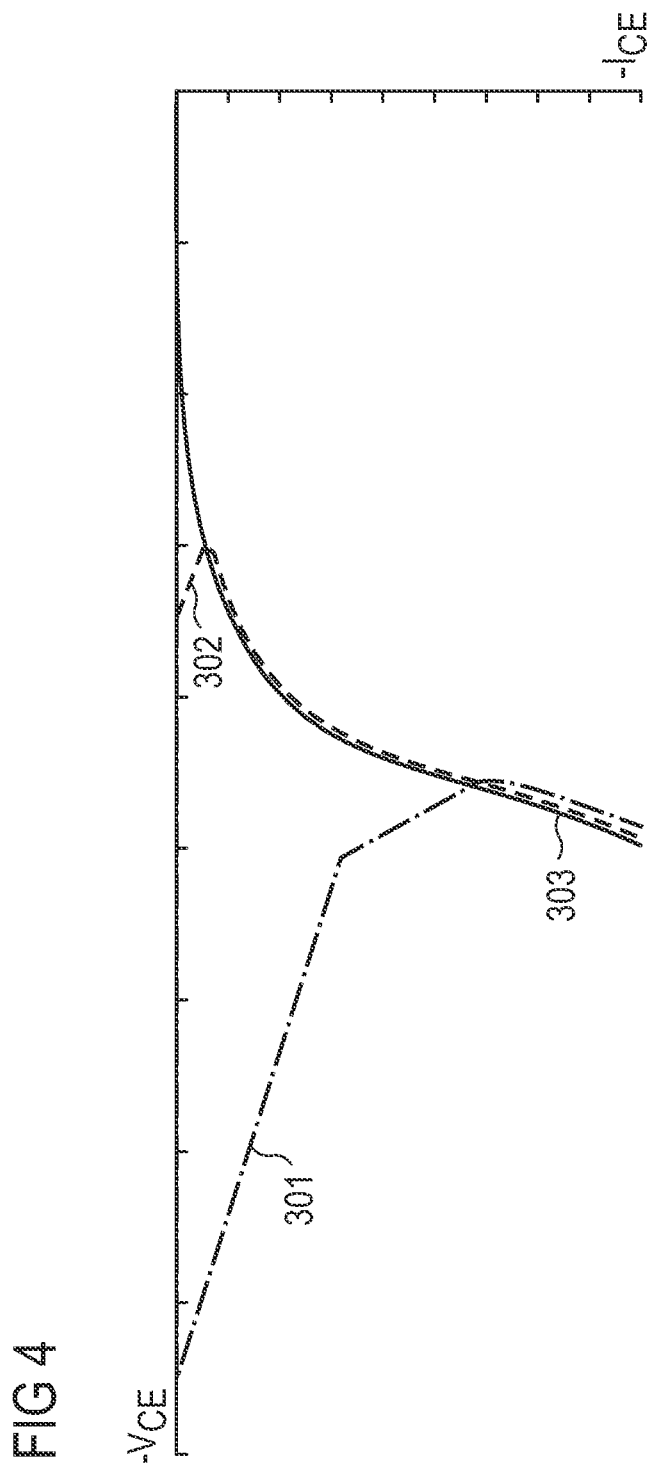
FIG. 4 illustrates the snap-back behavior of switchable and non-switchable diode cells under different operating conditions in reverse conductive mode.

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The embodiments being described use specific language, which should not be construed as limiting the scope of the appended claims.

In this specification, a second side or surface of a semiconductor substrate is considered to be formed by the lower or back-side side or surface while a first side or surface is considered to be formed by the top or main side or surface of the semiconductor substrate. The terms "above" and "below" as used in this specification, likewise "top" and "bottom," therefore describe a relative location of a structural feature to another structural feature with consideration of this orientation. Furthermore, spatially relative terms such as "under", "below", "lower", "over", "upper" and the like, are used for ease of description to explain the positioning of one feature relative to a second feature. These terms are intended to encompass different orientations of the device in addition to different orientations than those depicted in the figures. Further, terms such as "first", "second", and the like, are also used to describe various features, regions, sections. etc. and are also not intended to be limiting. Like terms may refer to like features throughout the description.

Herein, particularly when referring to the trench, gate electrode, and/or conductor, for example, the "length," "extension," and "extent" can be used interchangeably, and can refer to a long axis of the feature. "Width" can refer to the direction of the structure which is perpendicular to the extension. "Width" and "length" can also refer to dimensions in the width and length directions, respectively.

The terms "electrical connection" and "electrically connected" describes an ohmic connection between two features.

The term "channel region" and "switchable channel region" describes a portion of the body region adjacent to and along the gate dielectric where the so-called inversion channel is formed under the influence of the field effect. The channel region (switchable channel region) is a unipolar channel region.

Herein, a "normal projection" onto a plane or surface means a perpendicular projection onto the plane or surface. In other words, the view direction is perpendicular to the surface or plane.

The semiconductor substrate can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

N-doped regions are referred to as of first conductivity type while p-doped regions are referred to as of second conductivity type. It is, however, possible to exchange the first and second conductivity type so that the first conductivity type is p-doped and the second conductivity type is n-doped.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

FIGS. 1A to 1C illustrate a semiconductor device according to an embodiment in different operational modes. FIG. 1 illustrates a forward mode—or a forward conductive mode—with a positive gate voltage of, for example, +15 V, applied to the gate electrodes of the semiconductor device. The collector-emitter voltage $V_{CE}$ is positive, i.e. the technical current flow is from collector terminal C to the emitter terminal E. The physical current flow of the electrons is from the emitter terminal E to the collector terminal C. A forward conductive mode generally means that, in case of n-channel devices as illustrated in the embodiments below, a positive gate voltage above a gate threshold voltage $V_{th}$ is applied to the gate electrodes to form respective inversion channels in switchable channel regions between the source and the drift region, and that the collector-emitter voltage $V_{CE}$ is positive (collector terminal C is positive relative to emitter terminal E). A forward blocking mode generally means that, in case of n-channel devices, a gate voltage below the gate threshold voltage $V_{th}$ is applied so that no inversion channels between the source and the drift regions are formed, and that the collector-emitter voltage $V_{CE}$ is positive.

The semiconductor device can be a power RC-IGBT and includes a semiconductor substrate 100, a front metallization 171 on a first or main surface or side 101 of the semiconductor substrate 100, and a back metallization 172 on a second or bottom surface or side 102 of the semiconductor substrate 100. The front and back metallizations 171 and 172 are for example illustrated in FIGS. 10, 11 and 14.

The semiconductor device includes a plurality of doping regions. The semiconductor substrate 100 is typically weakly n-doped. Highly n-doped source regions 111 can be integrated in the semiconductor substrate 100 at the first surface or first side 101. The source regions 111 form respective pn-junctions with p-doped body regions 112. The body regions 112 also forms respective pn-junctions with an n-doped drift region 113, which pn-junctions are different to, and spaced apart from, the pn-junctions formed between the body regions 112 and the source regions 111. The drift region 113 is typically formed by a portion of the weakly n-doped substrate 100 into which the other doping regions are integrated by implantation or other suitable processes.

At a side toward the second surface or second side 102, the drift region 113 forms pn-junctions with p-doped emitter regions 114, which form emitter regions of the second conductivity type. In addition to that, n-doped emitter regions 116, which form emitter regions of the first conductivity type, are also integrated in the semiconductor substrate 100 at the second surface 102. The n-doped emitter regions 116 and the p-doped emitter regions 114 are electrically in contact (ohmic connection) with the back metallization 172 that is connected to the collector terminal C. Typically, the back metallization 172 is in direct contact with the n-doped emitter regions 116 and the p-doped emitter regions 114.

An optional n-doped buffer or field stop layer can be integrated into the semiconductor substrate 100 between the drift region 113 and the respective emitter regions 114 and 116, or only between the drift region 113 and the p-doped emitter regions 114. The buffer or field stop layer has a higher doping concentration than the drift region 113 but typically a lower doping concentration than the n-doped emitter regions 116. The emitter regions 114, 116 are both highly doped. A buffer or field stop layer 117 is, for example, illustrated in FIGS. 12 and 13, and can be integrated in all of the embodiments illustrated herein. Typically, most modern devices include a buffer or field stop layer 117. Devices which include such buffer or field stop layer are also referred to as punch-through devices.

The body regions 112 are in electrical connections with the front metallization 171 which is in electrical connection with the emitter terminal E. To improve the ohmic connection between the body regions 112 and the front metallization 171, highly p-doped body contact regions 115 can be provided at the first surface 101. The source regions 111 are also in direct electrical connection with the front metallization 172. Typically, the front metallization 171 is in direct contact or connection with the body regions 112, or the body contact regions 115, and the source regions 111.

The semiconductor device further includes a plurality of trenches 120 integrated into the semiconductor substrate 100. The trenches 120 extends vertically from the first surface 101 into the semiconductor substrate 100 and can include respective gate electrodes 121 which are electrically insulated from the surrounding semiconductor substrate 100 by a gate dielectric 122. The trenches 120 can extend longitudinally in rows. The longitudinal extension runs here perpendicular to the plane of the FIGS. 1A to 1C. Other geometrical shapes for the trenches 120 such as hexagonal shapes, when seen in normal projection onto the first surface 101, are also possible. Mesa regions 125 are formed by the semiconductor substrate 100 between adjacent trenches 120.

A plurality of IGBT cells 141 are integrated in the semiconductor substrate 100 and form at least one IGBT cell region. Each of the IGBT cells 141 includes an operable switchable channel region 151 for providing an ohmic connection, i.e. a controllable ohmic connection, between the front metallization 171 and the drift region 113 of the semiconductor substrate 100. The switchable channel regions 151 are formed in the body regions 112 adjacent to the trenches 120 along the extension of the gate electrodes 121. When a positive voltage above a given gate threshold voltage $V_{th}$ is applied to the gate electrodes 121, electrons are accumulated in the switchable channel regions 151 to form a unipolar conductive path (for electrons only), i.e. the so-called inversion channel, between the source regions 111 and the drift regions 113. Hence, the ohmic connection provided by the switchable channel regions 151 is controllable through the voltage applied to the gate electrodes 121.

A plurality of switchable diode cells 143 are integrated in the semiconductor substrate 100 and form at least one switchable free-wheeling diode region. Each of the switchable diode cells 143 includes a pn-junction between the respective body region 112 and a portion of the drift region 113, and a switchable channel region 153 for short-circuiting the pn-junction of the respective switchable diode cell 143 and for providing an ohmic connection, i.e, controllable ohmic connection, through the respective switchable diode cell 143 between the front metallization 171 and the back metallization 171.

A plurality of non-switchable diode cells 142 are also integrated in the semiconductor substrate 100 and form at least one non-switchable free-wheeling diode region. Each of the non-switchable diode cells 143 includes a pn-junction between the respective body region 112 and the drift region 113.

The lateral geometric extension of a cell as shown here corresponds to the pitch at which the trenches 120 are laterally spaced. As illustrated in FIG. 1A, the structure of the mesa region 125 between two adjacent trenches 120 is shown to be mirror-symmetrical, i.e. the mesa region 125 forms with the first of the two adjacent trenches 120 the same type of cell as with the second of the two adjacent trenches 120. It is, however, also possible that different types of cells are integrated in the same mesa region 125. For example, different types of cells can be formed at different locations in the longitudinal extension of the mesa regions 125, or at opposite sides of adjacent trenches 120. The type of cell can thus vary in the longitudinal extension (direction) of the trenches 120 and mesa regions 125, or laterally, i.e. along a direction perpendicular to the longitudinal extension. When referring to FIGS. 1A to 1C, the longitudinal extension of the trenches 120 and mesa regions 125 is perpendicular to the plane of the Figures while the lateral direction is in the left-right direction of the Figures.

In view of the above, according to an embodiment, each of the switchable diode cells 143 and each of the IGBT cells 141 can have a source region 111 of a first conductivity type in ohmic connection with the front metallization 117, a drift region 113 of the first conductivity type, a body region 112 of a second conductivity type arranged between the source region 111 and the drift region 113 and forming respective pn-junctions with the source region 111 and the drift region 113.

Furthermore, in view of the above, according to an embodiment, each of the switchable diode cells 143 and each of the IGBT cells 141 can include a gate electrode 121 arranged adjacent to and electrically insulated from the body region 112 to define the respective switchable channel region 151, 153 of each of the switchable diode cells 143 and the IGBT cells 141.

In view of the above, according to an embodiment, each of the non-switchable diode cells 142 can have a drift region 113 of the first conductivity type and a body region 112 of the second conductivity type which forms a pn-junction with the drift region 113, wherein the body region 112 is in ohmic connection with the front metallization 171.

According to an embodiment, at least some of the non-switchable diode cells 142 include a body contact region 115 of the second conductivity embedded in the body region 112 and having a higher doping level than the body region 112, wherein the body contact region 115 forms an ohmic connection with the front metallization 171.

Each of the respective regions, i.e. the IGBT cell region, the non-switchable free-wheeling diode region and the switchable free-wheeling diode region, typically includes a plurality of respective identical cells. Clustered cells of the same cell type form the respective region. It is, however, also possible to partially integrate a first type of cell into a region which is predominantly formed by a second type of cells. For example, few non-switchable diode cells 142 can be integrated into a switchable free-wheeling diode region, i.e. a region which is predominantly formed by switchable diode cells 143. Furthermore, dummy cells, i.e. cells which do not contribute to the current flow, neither in forward nor reverse conductive mode, can also be integrated into some or each of the above mentioned cell regions.

However, the non-switchable free-wheeling diode region or regions typically does not comprise any operable switchable channel region 151, 153, i.e. neither a switchable diode cell 143 nor an IGBT cell 141 is integrated within the area assumed by the non-switchable free-wheeling diode region. A non-switchable free-wheeling diode region can thus also be defined to be a region where no cell with an operable switchable channel region 151, 153 is formed. An operable switchable channel region 151, 153 is a region where an inversion channel can be formed when applying a positive voltage (or a negative voltage if the doping relations are reversed) to an adjacent gate electrode 121. As described further below, when no operable switchable channel region 151, 153 is formed within the non-switchable free-wheeling diode region, the functional operation of the non-switchable free-wheeling diode region is not affected by the action of the operable switchable channel region 151, 153, i.e. whether a gate voltage is applied or not. This is beneficial for specific operational modes of the semiconductor device.

To avoid formation of the operable switchable channel region 151, 153 within the non-switchable free-wheeling diode region, the gate electrodes in the trenches 120, which are formed in the non-switchable free-wheeling diode region, can be electrically insulated from the gate terminal so that no gate voltage is applied. Alternatively, no gate electrodes are formed in the trenches 120 and/or no source regions 111 are formed and/or the source regions 111 are not electrically connected to the emitter terminal E.

When a positive voltage such as +15 V is applied to the gate electrodes of the IGBT cells 141 and of the switchable diode cells 143, a conductive path is formed in the respective switchable channel region 151, 153 which short-circuits the pn-junctions between the body region 112 and the drift region 113, and between the source region 111 and the body region 112, respectively. An electron current can thus flow from the source regions 111 to the drift region 113 and finally to the p-doped emitter regions 114 and the n-doped emitter regions 116 when a positive collector-emitter voltage $V_{CE}$ is applied between the collector terminal C and the emitter terminal E. The flow of the electrons is indicated by the downward pointing arrow while the flow of the positive holes is indicated by the upward pointing arrow. The holes do not flow through the switchable channel region 151, 153 as they can easily pass the pn-junction between the body region 112 and the drift region 113. The holes are injected from the p-doped emitter regions 114. The IGBT cells 141 thus carry a bipolar current. The dashed ellipses in the Figures roughly illustrate the region in the body region 112 where the respective switchable channel regions 151, 153 are formed.

The switchable diode cells 143 can also carry a bipolar current in forward mode. In an embodiment, as for example shown in FIGS. 7A and 7B, the switchable diode cells 143 are arranged opposite a region of alternating n-doped emitter regions 116 and p-doped emitter regions 114. The p-doped emitter regions 114 thus inject holes also in the area where the switchable diode cells 143 are formed.

In the forward conductive mode as illustrated in FIG. 1A, the non-switchable diode cells 142 are "inactive" as the pn-junction between the body region 112 and the drift region 113 blocks any electron flow through the non-switchable diode cells 142.

A reverse conductive mode of operation is illustrated in FIG. 1B with a negative collector-emitter voltage $V_{CE}$ applied between the collector terminal C and the emitter terminal E. In this case, a reverse current flows which may be driven by an unillustrated inductive load. FIG. 1B also shows that a positive gate voltage is applied which means that respective inversion channels are formed in the switchable channel regions 151, 153 of the IGBT cells 141 and the switchable diode cells 143, respectively. However, a current through the IGBT cells 141 is prevented due to the reversely biased pn-junction between the drift region 113 and the p-doped emitter region 114 which is arranged at the second surface 102. On the other hand, an electron flow is possible through the switchable diode cells 143, since at least some n-doped emitter regions 116 are formed opposite to the switchable diode cells 143 so that there are no blocking pn-junctions.

FIG. 1B also shows that a bipolar current flows through the non-switchable diode cells 142. Such a bipolar current is enabled when the voltage difference over the pn-junction between the body region 112 and the drift region 113 is equal to or larger than the required forward voltage drop of this pn-junction.

Hence, both the switchable diode cells 143 and the non-switchable diode cells 142 can carry a reverse current. Reverse current means that a current flow (direction of the technical current flow) is reverse with respect to the current flow (direction of the technical current flow) of the forward conductive mode. The technical current flow is defined to be the direction in which positive charge carriers flow.

The contribution of the non-switchable diode cells 142 to the reverse current is typically larger as the bipolar current is significantly larger than the unipolar current due to the additional injection of holes from the body region 112 into the drift region 113. The bipolar current through a single non-switchable cell 142 can be up to about 100 times larger than the unipolar current through a switchable cell 143 on the assumption that cell parameters such as size, area and doping relations are comparable. Holes are not injected from the body region 112 into the drift region 133 near the switchable diode cells 143 as long as there is a conductive path formed in the switchable channel region 153 (see FIG. 1A) that short-circuit the pn-junction between the body region 112 and the drift region 113 of the switchable cell 143.

FIG. 1C illustrates the reverse conductive mode when the gate voltage applied to the gate electrodes 121 is below the gate threshold voltage $V_{th}$ to generate an inversion channel. As shown in FIG. 1C, the switchable diode cell 143 now functions as "normal" diode as no inversion channel is formed in the switchable channel region 153 (see FIG. 1A) which could short-circuit the pn-junction between the body region 112 and the drift region 113. Thus, when a gate voltage below the gate threshold voltage $V_{th}$, or no gate voltage, is applied, a large bipolar reverse current can be carried by the switchable and non-switchable diode cells 143, 142.

When comparing FIGS. 1B and 1C, the two possible conductive modes of operation for the switchable diode cells 143 in reverse condition ($I_{CE}$<0 A or $V_{CE}$<0 V) become apparent. When a gate voltage above the gate threshold voltage $V_{th}$ is applied to the gate electrode 121 of the switchable diode cell 143, only a unipolar current can flow through the switchable diode cells 143. However, when a gate voltage below the gate threshold voltage $V_{th}$ is applied, a bipolar current can flow through the switchable diode cells 143 which is significantly larger than the unipolar current due to the injected holes. The switchable diode cells 143 can thus be "switched" between a unipolar current mode and a bipolar current mode.

Such switching is not possible for the non-switchable diode cells 142 as the formation of an inversion channel that can short-circuit the pn-junction between the body region 112 and the drift region 113 is prevented in the non-switchable cells 142. The non-switchable diode cells 142 have therefore only a bipolar current mode.

However, the non-switchable diode cells 142 might be inactivated, or influenced, by the formation of the inversion channels formed in adjacent switchable cells 143 or IGBT cells 141. This is illustrated in FIGS. 2A to 2C for a transition region formed between adjacent switchable diode cells 143 and non-switchable diode cells 142.

A non-switchable freewheeling cell region 1142 is defined by a plurality of non-switchable diode cells 142a, 142b, 142c, 142d, and a switchable free-wheeling diode region 1143 is defined by a plurality of switchable diode cells 143. As will be described in connection with FIGS. 2A to 2C, the "outer" non-switchable diode cells 143 might be inactivated when an inversion channel is formed in adjacent switchable diode cells 143.

FIG. 2A illustrates the operation when $V_{CE}$ is negative, i.e. in reverse conductive mode. In practical applications, such as when the IGBT is used for driving an inductive load, the inductive load drives a collector-emitter current $I_{CE}$ which results, depending on the resistance of the IGBT, in a collector-emitter voltage $V_{CE}$. Although the $I_{CE}$ is the actual source, typically the resultant emitter-collector voltage $V_{CE}$ is illustrated as the resulting voltage $V_{CE}$ mainly determines the behavior of the semiconductor device. Note that $I_{CE}$ is negative here and therefore also $V_{CE}$.

$V_{CE}$, which is illustrated here to be $V_{CE1}$, is very small when $I_{CE}$ is small (at the onset of the reverse current when the current through the device transits from forward to rearward current), i.e. the absolute value of $V_{CE1}$ is smaller than the forward voltage drop needed to generate a bipolar current flow, for example $|V_{CE}|$<0.7 V for semiconductor devices having a semiconductor substrate 100 made of Si. The only available current flow is the unipolar current through the switchable cells 143 as a gate voltage above gate threshold voltage $V_{th}$ is applied to the gate electrodes 121 of the switchable diode cells 143. The gate electrodes 121 within the trenches 120 of the non-switchable diode cells 142a, 142b, 142c, 142d are inactive or not electrically connected to the gate terminal G, or no source regions 121 are formed or the source regions are not electrically connected to the emitter terminal E. In any of these cases, no operable switchable channel region is provided in the non-switchable diode cells 142a, 142b, 142c, 142d that allows formation of an inversion channel to provide an ohmic connection between the emitter terminal and the drift region 113 by short-circuiting the pn-junction between the body region 112 and the drift region 113.

Due to the formation of the inversion channel in the switchable channel region 153 of the switchable diode cells 143, the pn-junction between the body region 112 and the drift region 113 of the switchable diode cells 143 is short-circuited and the electrical potential of the drift region 113 close to the short-circuited pn-junction is approximately at the electrical potential of the emitter terminal E. The collector-emitter voltage $V_{CE}$ thus mainly drops over the drift region 113. The "pinning" of the electrical potential by the switchable diode cells 143 also affects the electrical potential of the drift region 113 close to the non-switchable diode cells 142 which are arranged next to the switchable diode cells 143 due to the lateral voltage drop that occurs laterally within the drift region 113 close to the pn-junctions between the body regions 112 and the drift region 113. The vertical extension of the drift region 113 is typically significantly larger than illustrated here. For example, the vertical extension of the drift region 113 can be, for example, 10-times the vertical extension of the body regions 112. The "thickness", i.e. the vertical extension of the drift region 113 mainly depends on the rated blocking voltage of the semiconductor device.

The "vertical" voltage drop within the drift region 113 therefore also occurs "laterally" which is indicated by the lateral local resistances $R_D$ of the drift region 113. As a consequence, the voltage, or electrical potential, of the drift region 113 close to the pn-junction of the non-switchable diode cells 142a to 142d adjacent to the switchable diode cells 143 is similar to the voltage applied to the emitter terminal E. As the voltage applied to the emitter terminal E is also applied to the body contact regions 115 and thus to the body regions 112 of the non-switchable diode cells 142a to 142d, the voltage drop over the pn-junction of the non-switchable diode cells 142a to 142d is less than the required forward voltage drop of the pn-junction between the body region 112 and the drift region 113. Therefore, the non-switchable diode cells 142a to 142d are "inactive" at a small $V_{CE}$.

When $V_{CE}$ decreases more, i.e. the absolute value of $V_{CE}$ becomes larger due to a decrease of $I_{CE}$ (i.e. $I_{CE}$ becomes more negative; the absolute value of $I_{CE}$ increases), the lateral voltage drop increases so that the voltage drop over the pn-junction for more remote non-switchable diode cells 142c and 142d, i.e. for non-switchable diode cells 142 which are arranged remote from the switchable diode cell 143, becomes larger than the required forward voltage drop. As a consequence, the pn-junctions starts to inject charge carriers and a bipolar current can flow through the more remote non-switchable diode cells 142c and 142d. The non-switchable diode cells 142a and 142b which are arranged closer to the switchable diode cells 143 remain inactive since the lateral voltage drop is not large enough to generate a sufficiently high voltage drop over the pn-junction of the non-switchable diode cells 142a and 142b. This mode of operation is illustrated in FIG. 2B when the resulting collector-emitter voltage $V_{CE}$ is $V_{CE2}$ according to the relation $V_{CE2} < V_{CE1} < 0$ V.

The voltage $V_{CE}$ at which the non-switchable diode cells 142, which are arranged remote from the switchable diode cell 143, becomes conductive in bipolar mode is referred to as $V_{CE,th}$, which is the threshold voltage of the non-switchable diode cells 142. In practical applications $|V_{CE,th}|$, i.e. the absolute value of $V_{CE,th}$, can be less than 7 V, particularly less than 5 V, more particularly less than 3 V, and even more particularly less than 1 V.

When $I_{CE}$ decreases further and so that $V_{CE}$ becomes $V_{CE3}$ with $V_{CE3} < V_{CE2}$, the lateral voltage drop becomes sufficiently large for the non-switchable diode cell 142b but may not be large enough for the non-switchable diode cell 142a which is the non-switchable diode cell closest to the switchable diode cells 143. FIG. 2C illustrates this mode of operation. The non-switchable diode cell 142a remains inactive while the other non-switchable diode cells 142d to 142b are active, i.e. these cells carry a reverse current (bipolar current).

If the voltage applied to the gate electrode 121 of the switchable diode cell 143 is less than the gate threshold voltage $V_{th}$ needed to generate an inversion channel, all non-switchable diode cells 142a to 142d and also the switchable diode cell 143 are in forward diode mode of operation for sufficiently large $V_{CE}$, i.e. when the voltage drop over the pn-junctions between the respective body regions 112 and the drift region 113 becomes larger than the forward voltage drop. In this situation, all diode cells carry a bipolar reverse current. This operation mode is indicated, for example, in FIG. 1C.

The electrical characteristics for the modes of operation described above are illustrated in FIGS. 3 and 4. For sake of illustration only, curves 201 and 202 of FIG. 3 illustrates the characteristics of a single switchable diode cell 143. The curves 201, 202, 203 illustrate $I_{CE}$ (collector-emitter current) versus $V_{CE}$ (collector-emitter voltage) in the reverse conductive mode, which is in the third quadrant of a full diode characteristic. $V_{CE}$ is negative here as the voltage at the collector terminal C is negative relative to the voltage at the emitter terminal E. $I_{CE}$ is therefore also negative. The situation would be reversed with reversed doping relations.

Curve 201 illustrates the $I_{CE}$-$V_{CE}$ characteristics for the switchable cell 143 when a gate voltage is applied to form an inversion channel and curve 202 illustrates the $I_{CE}$-$V_{CE}$ characteristics for the switchable cell 143 when no gate voltage is applied or a negative gate voltage is applied to the gate electrode of the switchable cell 143. $V_D$ represents the forward voltage drop at which the pn-junction between the body region 112 and the drift region 113 becomes conductive (forward diode current). Curve 201 is substantially linear as the "resistance" of the inversion channel remains substantially constant.

When a gate voltage is applied to the gate electrode of the switchable cell 143, the inversion channel is formed and only a unipolar current, i.e. an electron current can flow through the switchable diode cell 143. If no gate voltage is applied, the pn-junction of the switchable cell "ignites" and a bipolar current flows when $V_{CE} < V_D$, i.e. when the absolute value of $V_{CE}$ is larger than that of $V_D$. $V_D$ represents the required forward voltage drop over a pn-junction to render the pn-junction conductive. Due to the injection of holes from the body region 112 into the drift region 113, the resistance significantly reduces so that a larger current can flow. The voltage $V_{CE}$ that drops over the device is therefore much smaller after the pn-junction became conductive in comparison to the case when the pn-junctions are not conductive. The switchable diode cell 143 can thus carry a significantly higher current when operated in bipolar mode.

The characteristics of a single switchable diode cell 143 can therefore be switched between the curves 201 and 202 depending on whether a gate voltage is applied or not. The switching between the curves 201 and 202 is indicated by the arrow 206. The switchable diode cell 143 can therefore be switched between a bipolar mode and a unipolar mode.

The diode characteristic of a single non-switchable diode cell 142 is basically similar to curve 202 under the assumption that the doping relation and the area assumed by the switchable diode cell 143 and non-switchable diode cell 142 are comparable. Assume, for illustration purposes, that the non-switchable diode cell 142 is arranged immediately next to the switchable diode cell 143, the non-switchable diode cell 142 would then be inactive when the inversion channel is formed due to the applied gate voltage. When no gate voltage is applied, both the switchable cell 143 and the non-switchable cell 142 are in bipolar mode and their common characteristic is illustrated by curve 203 since both cells 142, 143 together have a larger cross-sectional area through which current can flow. Depending on whether a gate voltage is applied to the switchable cell 143 or not, a switching between curve 201 (only switchable cell 143 in unipolar mode, non-switchable cell 142 inactive) and curve 203 (both cells 142, 143 in bipolar mode) is possible. This switching is indicated by arrow 207.

If, on the other hand, the non-switchable cell 142 would be sufficiently spaced from the switchable cell 143 so that the formation of the inversion channel in the switchable cell 143 would not affect the diode function of the non-switchable cell 143, the common characteristic of both cells 142, 143 would be mainly govern by the characteristic of the non-switchable cell 142 in the case that the gate voltage is applied as the unipolar current of the switchable diode cell 143 is significantly smaller than the bipolar current of the non-switchable cell 142 at the same $V_{CE}$. Hence, a switching occurs between curve 202 (unipolar current of the switchable diode cell 143 is negligible with respect to the bipolar current of the non-switchable cell 142) and the curve 203 when both diode cells 142, 143 are in bipolar mode. The switching is indicated by arrow 208.

The combined behavior of the switchable diode cells 143 and the non-switchable diode cells 142 is further elaborated with reference to FIG. 4.

FIG. 4 illustrates situations where a reverse current is impressed (driven) by, for example, an inductive load. The collector-emitter voltage $V_{CE}$ appearing between collector terminal C and emitter terminal E is then depending on the "resistance" of the semiconductor device which is defined by the conductivity of the individual cells. In reverse conductive mode, the IGBT cells 141 do not contribute to the reverse current as their resistance for reverse current is virtually infinite.

For understanding FIG. 4, it is assumed that the semiconductor device transits from the forward conductive mode to the reverse conductive mode. Any current flow for desaturation is neglected. At the onset of the reverse current, i.e. the reverse current $I_{CE}$ is close to zero, the non-switchable diode cells 142 are not yet conductive since the voltage drop over the pn-junctions between the body regions 112 and the drift region 113 is less than the forward voltage drop of these pn-junctions. When the magnitude (absolute value) of $I_{CE}$ increases, $V_{CE}$ increases as well until the pn-junctions between the body regions 112 and the drift regions 113 of the non-switchable cells 142 "ignites" and the diodes formed by these pn-junctions becomes conductive.

Curve 303 illustrates the situation when all non-switchable diode cells would not be affected by any switchable channel region, i.e. would function as "normal" free-wheeling diodes.

Curve 301 illustrates the situation when the formation of inversion channels in the switchable diode cells 143 inactivates all non-switchable cells 142 at low $I_{CE}$. This is the case, for example, when the switchable cells 143 and the non-switchable cells 142 are mixed and arranged close to each other, or when IGBT cells 141 are mixed with non-switchable cells 142. Since the non-switchable diode cells 142 are not yet conductive, the resistance of the semiconductor device is still high and $V_{CE}$ increases sharply. When $V_{CE}$ becomes comparably large, few non-switchable diode cells 142 are rendered conductive because of the increased lateral voltage drop as described above. This means that the lateral voltage drop for the non-switchable diode cell 142, which is most remote from the nearest switchable cell 143 where an inversion channel is formed, becomes large enough so that this non-switchable cell transits into the bipolar mode. Since the conductivity of this non-switchable diode cell 142 is much larger (or its resistance much lower) than the conductivity (resistance) of the switchable diode cells 143, the total resistance of the semiconductor device decreases and therefore the curve 301 "snaps back" toward curve 303. With a further increase of the magnitude of $I_{CE}$, more non-switchable diode cells 142 transit into the bipolar mode until finally all non-switchable diode cells 142 are conductive so that the curve 301 becomes substantially identical to curve 303 at large values of $I_{CE}$.

Curve 302 illustrates the situation when the onset of the bipolar mode for the most remote non-switchable cell starts at smaller absolute values for $I_{CE}$. This is the case when the minimal distance between the most remote non-switchable diode cell 142 and the nearest switchable diode cell 143 is larger than for the case of curve 301, as in this case the lateral voltage drop between these two cells is larger.

The snapping-back behavior as illustrated in FIG. 4 is not desired as the formation of inversion channels reduces the available "diode" area for conducting a reverse current at least at the onset of the reverse current. The snapping-back behavior is particularly pronounced when the switchable and non-switchable diode cells 142, 143 are mixed and therefore a sufficiently large lateral voltage drop to render the non-switchable diode cells 142 conductive is only generated at a large $V_{CE}$. Since the diode cells (non-switchable diode cells 142 and/or switchable diode cells 143) which are already conductive would have to carry the full reverse current through the semiconductor device, the current amplitude per conductive diode cell would be very large which could lead to a malfunction of the whole semiconductor device.

To avoid or at least significantly reduce this, the non-switchable diode cells are grouped or clustered so that the minimal distance between a central cell of the clustered non-switchable diode cells and the nearest switchable diode cell (or IGBT cell) becomes large. As a result of this increased distance, the lateral voltage drop becomes large even at comparably small $V_{CE}$ so that some or most of the cells of the clustered non-switching diode cells are rendered conductive even at small $V_{CE}$ which correspond to small $I_{CE}$. The clustered non-switchable diode cells are therefore rendered conductive at comparably smalls (absolute value) of $I_{CE}$ and can carry the reverse current.

As a consequence, the snapping-back behavior can also be avoided. Furthermore, because at least some of the clustered non-switchable diode cells 142 becomes conductive even at low $I_{CE}$ (the resulting voltage drop $V_{CE}$ is also low), applying a gate voltage to the gate electrodes of the switchable cells 143 does not affect the behavior of the non-switchable diode cells 142 that form part of the free-wheeling diode region. Furthermore, keeping the gate voltage applied to the gate electrodes is beneficial for many applications. As the switching between forward and reverse current occurs very frequently, an additional current sensing unit may not be needed to accurately detect the current reversal.

As described above, to reduce the above mentioned influence of the switchable channel regions while allowing the gate voltage to be applied during reverse conductive mode, the non-switchable free-wheeling diode region 1142 formed by the non-switchable diode cells 142 does not include any operable switchable channel region 151, 153 so that there is a sufficient minimum lateral distance to the next operable switchable channel region 151, 153. Even if non-switchable diode cells 142 arranged at the periphery of the non-switchable free-wheeling diode region 1142 may be affected, and thus could be inactivated, by the action of the operable switchable channel region 151, 153 of any of the IGBT cells 141 or switchable diode cells 143 arranged next to the non-switchable free-wheeling diode region 1142, non-switchable diode cells in the center of the non-switchable free-wheeling diode region 1142 remains unaffected.

These "central" non-switchable diode cells 142 can function as "normal" free-wheeling diode so that no snapping-back occurs or is negligible.

Furthermore, it is possible to selectively switch the switchable diode cells 143 between curve 201 and 202 (unipolar mode and bipolar mode). When integrating both the switchable free-wheeling diode region and the non-switchable diode region on the condition that the behavior of the non-switchable free-wheeling diode region is not affected by the switching of the switchable free-wheeling diode region, then the common characteristic of both regions would approximately correspond to the curves 202 and 203 depending on whether the switchable diode cells 143 are in the unipolar mode or bipolar mode. When the switchable diode cells 143 are in the unipolar mode, the common characteristic corresponds approximately to curve 202, and when these cells are switched into the bipolar mode, then the common characteristics approximately corresponds to curve 203. A snapping-back as explained above is not observable, or negligible, because the non-switchable diode cells 142, or at least most of the non-switchable diode cells, are not affected by the switchable diode cells 143. In the event that some but not all of the non-switchable diode cells 142 would be affected, their influence on the common characteristic would be small.

The non-switchable diode cells 142 are therefore "clustered" to form larger cell regions, i.e. one or more non-switchable free-wheeling diode region 1142. These cell regions can also be described as "meta cells" as each of the "meta cells" functions as a large diode for carrying a reverse current.

The clustering of the non-switchable cells 142 ensures that the reverse current is predominantly carried by a bipolar current and that the n-doped emitter regions 116 which are arranged opposite the non-switchable cells 142 can efficiently inject electrons into the drift region 113 during the reverse mode of the semiconductor device. Additionally, the latch-up risk can be reduced which further contributes to the robustness of the semiconductor device.

The semiconductor device can therefore have three different types of regions providing different functionality.

The IGBT cell region 1141 provides the actual IGBT function for switching a load current. According to an embodiment, the semiconductor device includes one single large IGBT cell region 1141 (which may form a simply connected area) which includes all IGBT cells 141.

The non-switchable free-wheeling diode region 1142 ensures that the semiconductor device is quickly rendered conductive when the load current, i.e. $I_{CE}$, transits from the forward current to the reverse current independently whether any of the switchable channel regions 151, 153 is conductive or not. The snapping-back behavior is suppressed and the semiconductor device is already reversely conductive at low reverse currents.

The switchable free-wheeling diode region 1143 can be operated either to function as a free-wheeling diode or as conductive electrical path for desaturating the drift region 113.

Each of the above types of regions can be optimized for their respective function without influencing one of the other types of regions. For example, the anode efficiency, i.e, the efficiency of the respective body regions 112 to inject charge carriers into the drift region 113, of the non-switchable free-wheeling diode region 1142 can be reduced in comparison to the adjacent portions of the switchable free-wheeling diode region 1143. The reduced anode efficiency reduces charge carrier injection which is beneficial when at the same time the semiconductor device is desaturated through the switchable free-wheeling diode region. The anode efficiency of the switchable free-wheeling diode region is typically not reduced so that, when the semiconductor device is not desaturated, the drift region 113 is flooded by charge carriers.

FIG. 1D shows embodiments for the local distribution of the different types of regions. In the left part of FIG. 1D, IGBT cell region 1141 assumes the central part of the semiconductor device when seen in plane projection onto the first surface 101. An area of the switchable freewheeling diode cell region 1143 surrounds the IGBT cell region 1141. Arranged within the area of the switchable freewheeling diode cell region 1143 there are formed a plurality of non-switchable freewheeling diode cell regions 2142 which are in this embodiment of the same size and at a constant lateral distance. The embodiment in the right part of FIG. 1D shows non-switchable freewheeling diode cell regions 3142 of varying size and distance.

In view of the above, the semiconductor substrate 100 includes, according to an embodiment, a plurality of spaced apart non-switchable free-wheeling diode regions 1142, 2142, 3142 each having a plurality of non-switchable diode cells 142, wherein the lateral distribution of non-switchable free-wheeling diode regions 1142, 2142, 3142 is inhomogeneous.

As explained above, a semiconductor device can include, according to an embodiment, a semiconductor substrate 100, a front metallization 171, a back metallization 172, and at least one IGBT cell region integrated in the semiconductor substrate 100 and having an operable switchable channel region 151 for providing an ohmic connection between the front metallization and a drift region 113 of the semiconductor substrate 100. The semiconductor device can further include at least one switchable free-wheeling diode region integrated in the semiconductor substrate 100 and having a pn-junction and an operable switchable channel region 153 for short-circuiting the pn-junction and for providing an ohmic connection through the switchable free-wheeling diode region between the front metallization and the back metallization. At least one non-switchable free-wheeling diode region can be integrated in the semiconductor substrate 100 and includes a pn-junction. The non-switchable free-wheeling diode region has a centroid when seen in normal projection onto the first surface 101, wherein the centroid of the non-switchable free-wheeling diode region is spaced from the nearest operable switchable channel region 153 by a distance of at least 30 μm or 40 μm (or a specific distance per conductivity (distance/conductivity) of between 300 μm*Ohm*cm to 30000 μm*Ohm*cm, particularly between 1000 μm*Ohm*cm to 10000 μm*Ohm*cm. The location of the centroid is schematically illustrated at 2142a for a non-switchable free-wheeling diode region 2142 in FIG. 1D. The nearest operable switchable channel region 153 is formed in the switchable free-wheeling diode region 1143 which surrounds the non-switchable free-wheeling diode region 2142 in FIG. 1D.

The minimal distance, or specific distance per conductivity, which is described above, can be expressed in geometrical terms or in relative terms depending on the conductivity of the drift region 113 as the conductivity of the drift region 113, as explained above, has an influence on the lateral voltage drop within the drift region 113.

The larger the above mentioned distance or specific distance is, the more non-switchable diode cells 142 remain unaffected by the action of the switchable channel regions 151, 153 of the IGBT cells 141 and the switchable diode cells 143.

In view of the above a semiconductor device of an embodiment includes a semiconductor substrate 100, a front metallization 171 on a first side 101 (or front surface) of the semiconductor substrate 100, and a back metallization 172 on a second side 102 (or second surface) of the semiconductor substrate 100. A plurality of IGBT cells 141 are integrated in the semiconductor substrate 100 and form at least one IGBT cell region, wherein each of the IGBT cells 141 includes an operable switchable channel region 151 for providing an ohmic connection between the front metallization and a drift region 113 of the semiconductor substrate 100. A plurality of switchable diode cells 143 are integrated in the semiconductor substrate 100 and form at least one switchable free-wheeling diode region, wherein each of the switchable diode cells 143 includes a pn-junction and a switchable channel region 153 for short-circuiting the pn-junction of the respective switchable diode cell 143 and for providing an ohmic connection through the respective switchable diode cell 143 between the front metallization and the back metallization. A plurality of non-switchable diode cells 142 are integrated in the semiconductor substrate 100 and form at least one non-switchable free-wheeling diode region, wherein each of the non-switchable diode cells 143 includes a pn-junction, wherein no operable switchable channel region 151, 153 is arranged between any two the non-switchable diode cells 143 of the plurality of the non-switchable diode cells 143 of the non-switchable free-wheeling diode region.

The IGBT cells 141 and the switchable diode cells 143 can have the same configuration at the first surface or first side 101. Both IGBT cells 141 and the switchable diode cells 143 can include source regions 111 and switchable channel regions 151, 153. IGBT cells 141, however, are arranged, particularly exclusively, opposite to p-doped emitter regions 114 which are formed at the second surface or second side 102 of the semiconductor substrate 100. In plane projection of the IGBT cells 141 onto the second side 102, all IGBT cells 143 are typically within an area which includes only p-doped emitter regions 114 and no n-doped emitter regions 116. Different thereto, the switchable diode cells 143 are arranged opposite of n-doped emitter regions 116 or a pattern of n-doped emitter regions 116 and p-doped emitter regions 114. In plane projection of the switchable diode cells 143 onto the second side 102, all switchable diode cells 143 are typically within an area which includes both p-doped emitter regions 114 and n-doped emitter regions 116.

The non-switchable diode cells 142 can also be arranged opposite of n-doped emitter regions 116 or a pattern of n-doped emitter regions 116 and p-doped emitter regions 114. In plane projection of the non-switchable diode cells 142 onto the second side 102, all non-switchable diode cells 143 are typically within an area which includes both p-doped emitter regions 114 and n-doped emitter regions 116.

According to an embodiment, the n-doped emitter regions 116 and the p-doped emitter regions 114 form a regular geometrical pattern such as a pattern of strips or a chessboard pattern. Any other type of pattern is also possible. A regular pattern of strips is for example shown in FIGS. 7A and 7B.

According to an embodiment, the n-doped emitter regions 116 and the p-doped emitter regions 114 form an irregular geometrical pattern with, for example increasing or decreasing ratio between the area assumed by the n-doped emitter regions 116 and the p-doped emitter regions 114 towards the outer periphery of the semiconductor device.

The area assumed by the n-doped emitter regions 116 and the p-doped emitter regions 114 can be equal within the pattern or can be different. For example, the total area assumed by the n-doped emitter regions 116 can be larger than the total area assumed by the p-doped emitter regions 114 in the pattern. Alternatively, the total area assumed by the n-doped emitter regions 116 can be smaller than the total area assumed by the p-doped emitter regions 114 in the pattern.

When forming n-doped emitter regions 116 and p-doped emitter regions 114 opposite the switchable free-wheeling diode cell region, which can be formed by, for example, clustered switchable diode cells 143, the switchable free-wheeling diode cell region can function in the forward conductive mode of the semiconductor device as IGBT cell and in the reverse conductive mode either as unipolar conductive cell (when a gate voltage is applied) or as "normal" diode cell for carrying a reverse bipolar current (when no gate voltage is applied).

The pattern of n-doped emitter regions 116 and p-doped emitter regions 114 opposite the switchable free-wheeling diode cell region can also be referred to as bimodal region as this region provides for two functions or modes of the switchable free-wheeling diode cell region, the bipolar mode (when no gate voltage or a gate voltage less than the gate threshold voltage $V_{th}$ is applied) and the unipolar mode (when a gate voltage large than the gate threshold voltage $V_{th}$ is applied).

According to an embodiment, in a normal projection onto the second side 102 of the semiconductor substrate 100, at least 50%, typically at least 55%, more typically at least 60% of the area covered by the non-switchable free-wheeling diode region 1142 is above an emitter region 116 of the second conductivity type (for example p-doped) formed at the second side 102 of the semiconductor substrate 100. The remaining area covered by the non-switchable free-wheeling diode region 1142 is then above an emitter region 116 of the first conductivity type.

According to an embodiment, in a normal projection onto the second side of the semiconductor substrate 100, at least 50%, typically at least 55%, more typically at least 60% of the area assumed by the emitter region or regions 116 of the first conductivity type (for example n-doped) formed at the second side 102 of the semiconductor substrate 100 is covered by the switchable free-wheeling diode region 1143 and/or portions of the IGBT cell region 1141. The remaining area covered by the switchable free-wheeling diode region 1143 is then above an emitter region 114 of the second conductivity type.

According to an embodiment, the non-switchable diode cells 142 or the non-switchable free-wheeling diode region or non-switchable free-wheeling diode regions are formed above the emitter region 116 of the first conductivity type.

According to an embodiment, each of the IGBT cells 141 or the IGBT cell region or IGBT cell regions is formed above the emitter region 114 of the second conductivity type.

According to an embodiment, the switchable diode cells 142 or the switchable free-wheeling diode region or switchable free-wheeling diode regions are formed above a bimodal region formed by a plurality of emitter region 116 of the first conductivity type and a plurality of emitter region 114 of the second conductivity type.

According to an embodiment, the total area of the non-switchable free-wheeling diode regions 1142 above the bimodal region, or above the emitter region 114 of the first conductivity type if no bimodal region is formed, is equal to or less than 50% of the total area of the bimodal region or the emitter region 114 of the first conductivity type if no bimodal region is formed. Typically, the total area of the non-switchable free-wheeling diode regions 1142 above the bimodal region, or above the emitter region 114 of the first conductivity type if no bimodal region is formed, is 5% to 50%, particularly 10% to 45%, more particularly 10% to 40%.

It should be noted that the semiconductor device as illustrated in FIGS. 1A to 1C and 2A to 2C is capable of blocking a positive $V_{CE}$ but substantially not a negative $V_{CE}$ due to the integrated free-wheeling diode regions.

As explained above, one or more non-switchable free-wheeling diode regions are provided which can include at least one strip or trench cell with an electrical connection of the body region 112 to the emitter terminal E, and which cell is not influenced by the action of a switchable channel region such as the n-channel of the switchable diode cell 143 or the IGBT cell 141. To this effect, the non-switchable cell is spaced sufficiently remote from a nearest switchable channel region 151, 153.

Multiple non-switchable diode cells 142 can be grouped or clustered and provided with specific properties which are different to properties of the switchable diode cells 143.

For example, in case of a non-desaturable RC-IGBT (gate voltage in the RC mode always at 0 V above a specific or predefined load current threshold $I_{det}$, and gate voltage always at, for example, +15 V, below $I_{det}$), the non-switchable cells 142 can be configured such that the above described snapping-back behavior is prevented or at least significantly reduced.

For a desaturable controllable RC-IGBT (for example RC-D-$C_{desat}$) it is desirable to reduce the anode efficiency relative to the regular RC-operation. For example, the anode efficiency of the non-switchable diode cells 142 can be reduced by selectively reducing the p-doping of the body regions 112 and/or by an n-doped barrier region directly below the body region 112. The anode efficiency of the switchable diode cells is not reduced, or only to a smaller extent, to provide for a large charge carrier flooding for the non-desaturating mode of operation, and to avoid influence on other modes of operation such as forward conductivity of the IGBT, IGBT switching behavior and IGBT hot blocking.

A reduced body doping is, for example, illustrated in FIGS. 2A to 2C which show the body regions 112a of the non-switchable diode cells 142 to have a lower p-doping, indicated by p−, in comparison to the body doping of the body regions 112 of the switchable diode cells 143, indicated by p.

As described above, each of the switchable diode cells 143 and each of the IGBT cells 141 can include a source region 111 of a first conductivity type in ohmic connection with the front metallization 117, a drift region 113 of the first conductivity type, a body region 112 of a second conductivity type arranged between the source region 111 and the drift region 113 and forming respective pn-junctions with the source region 111 and the drift region 113, and a gate electrode 121 arranged adjacent to and electrically insulated from the body region 112 to define the respective switchable channel region 151, 153 of each of the switchable diode cells 143 and the IGBT cells 141. Each of the non-switchable diode cells 142 includes a drift region 113 of the first conductivity type and a body region 112 of the second conductivity type which forms a pn-junction with the drift region 113. The body region 112 is in ohmic connection with the front metallization 171.

Furthermore, the semiconductor substrate 100 can include at least one emitter region 114 of the second conductivity type formed at the second side or second surface 102 of the semiconductor substrate 100 and at least one emitter region 116 of the first conductivity type at the second side or second surface 102 of the semiconductor substrate 100. The non-switchable diode cells 142 of the at least one non-switchable free-wheeling diode region are each formed above the emitter region 116 of the first conductivity type.

Typically, the IGBT cells 141 are formed mainly, or exclusively, opposite one or more emitter regions 114 of the second conductivity type (p-doped emitter region). Different thereto, the non-switchable diode cells 142 and the switchable diode cells 143 are each formed opposite one or more emitter regions 116 of the first conductivity type (n-doped emitter region) or opposite a pattern formed by emitter regions 114 of the second conductivity type (p-doped emitter region) and emitter regions 116 of the first conductivity type (n-doped emitter region). The non-switchable diode cells 143 can therefore serve as IGBT cells during forward conductive mode and as free-wheeling diode during reverse conductive mode.

The integration of the switchable free-wheeling diode region 1143 and the non-switchable free-wheeling is particularly beneficial at the transit from the forward conductive mode to the reverse conductive mode. Typically, a current detection unit is provided to detect the direction of the current so that the semiconductor device can be driven accordingly. However, at the transit from the forward conductive mode to the reverse conductive mode, the absolute value of the current is low and the current detection unit may fail to detect the correct direction of current flow. This is particularly relevant as the transit can occur at high rate.

Since the direction of the current is unknown when the current detection unit is unable to detect the current, the gate voltage remains applied. This could cause the snapping-back behavior at transit in semiconductor devices which do not have the clustered arrangement of the non-switchable diode cells 1142.

Furthermore, to reduce switching loss during switching, the semiconductor device can be kept in the bipolar mode for a given time $t'_1$ so that that the common characteristic of both the non-switchable free-wheeling diode region 1142 and the switchable free-wheeling diode region 1143 corresponds to curve 203 of FIG. 3 (no gate voltage applied). Shortly before transit, the switchable diode region 1143 is brought into the unipolar mode (gate voltage is applied), for duration $t''_1$, to reduce the flooding of the drift region 113. This means that the common characteristic of both the non-switchable free-wheeling diode region 1142 and the switchable free-wheeling diode region 1143 corresponds to curve 202 of FIG. 3.

More specifically, when the semiconductor device is operated in a reverse conductive mode, typically all IGBT cells 141 are non-conductive and all non-switchable diode cells 142 and switchable diode cells 143 are conductive and in the bipolar mode. In the reverse conductive mode, the semiconductor device is capable of carrying a reverse current through the diode cells 142, 143. In this mode, the switchable channel regions 151 are not conductive as a gate voltage below the gate threshold voltage $V_{th}$ is applied to the gate electrodes 121. To be more specific, the absolute value of the applied gate voltage is below the absolute value of the gate threshold voltage $V_{th}$.

In the forward blocking mode of the semiconductor device, the non-switchable diode cells 142, the switchable diode cells 143 and the IGBT cells 141 are in a non-conductive mode. The switchable channel regions 151 are not conductive as the gate voltage remains below the gate threshold voltage $V_{th}$.

Figure 6:
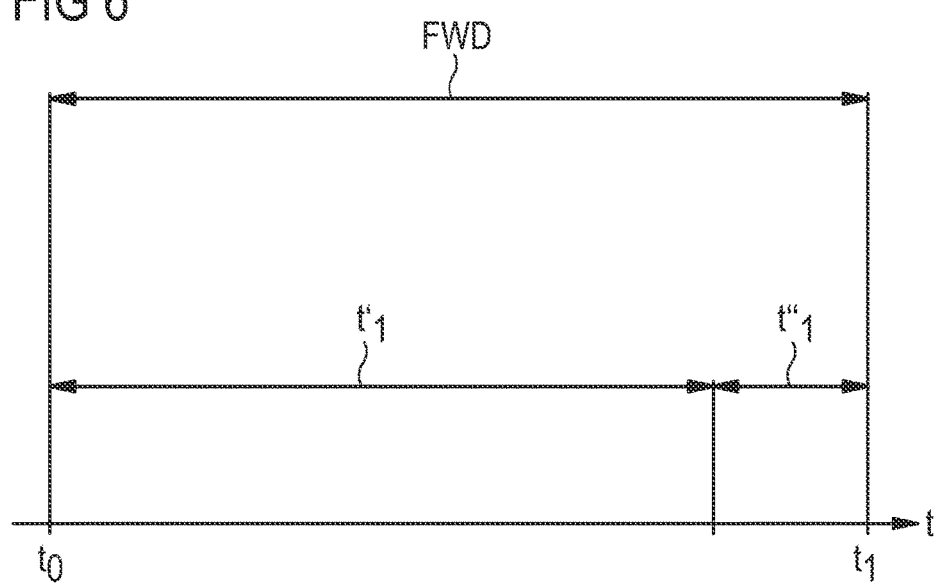
FIG. 6 illustrates the switching scheme for switching a semiconductor device, according to embodiments described herein, from forward conductive mode to forward blocking mode.

As illustrated in FIG. 6, the semiconductor device can be operated in a transit mode to bring the semiconductor device from the reverse conductive mode to the forward blocking mode. The transit mode is the mode during the duration $t''_1$. During the transit mode, the semiconductor device remains capable of carrying a reverse current which is mainly carried by the active non-switchable diode cells 142 which are in the bipolar mode. The switchable diode cells 143 and the IGBT cells 141 are in unipolar mode and may inactivate few non-switchable diode cells 142. The total number of diode cells which are in a bipolar mode are thus reduced so that the flooding of the drift region 113 with charge carriers is lower. Since a gate voltage having an absolute value larger than the gate threshold voltage $V_{th}$ is applied to the gate electrodes 121 during the transit mode, the switchable channel regions 151 are conductive to further facilitates desaturation of the drift region 113 and to reduce switching losses.

Both the transit mode and the reverse conductive mode form together the so-called free-wheeling operation mode of the semiconductor device which is indicated in FIG. 6 as FWD.

In the transit mode, the switchable channel regions 151 are conductive while in the preceding reverse conductive mode and the forward blocking mode, the switchable channel regions 151 are non-conductive. A gate voltage above the gate threshold voltage $V_{th}$ is thus only applied during the transit mode. The duration of the transit mode is typically shorter than the duration of the reverse conductive mode. For example, the ratio of $t''_1/t'_1$ (duration of the transit mode/duration of the reverse conductive mode) can be between 0.2 and 0.02 or for example 0.05.

Furthermore, the voltage drop appearing between the emitter collector terminals has the same sign during the transit mode and the reverse conductive mode. The voltage drop during the transit mode and the reverse conductive mode is the result of a reverse current which is impressed, for example, by an inductive load. The voltage drop appearing between the collector terminal and the emitter terminal during the transit mode and the reverse conductive mode can also be referred to as reverse voltage.

Different thereto, the voltage drop appearing between the emitter and collector terminals in forward blocking mode (and also in forward conductive mode) has an opposite sign to the voltage drop of the transit mode and the reverse conductive mode and can be referred to as forward voltage. The transit mode is therefore not comparable with the forward conductive mode. For example, for an IGBT with p-doped body regions, the voltage drop (forward voltage) appearing between the emitter and collector terminals in any forward mode is positive while the voltage drop (reverse voltage) is negative in both the reverse conductive mode and the transit mode.

The voltage drop appearing between the emitter and collector terminals thus changes the sign when bringing the semiconductor device from the transit mode to the forward blocking mode. No change of signs occurs when the semiconductor device is brought from the reverse conductive mode to the transit mode.

Figure 5:
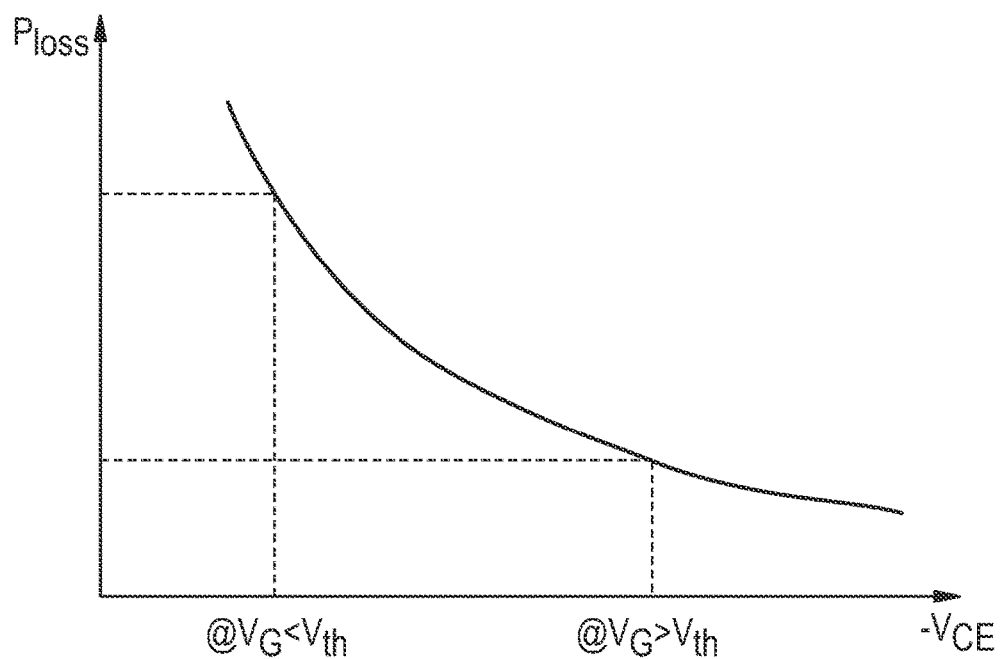
FIG. 5 illustrates the relation between the switching losses and the emitter-collector voltage for different modes of operation of the semiconductor device.

The above described switching scheme is indicated in FIG. 6. The corresponding relation between the switching losses $P_{loss}$ and the resulting collector-emitter voltage $V_{CE}$ for different gate voltages is illustrated in FIG. 5.

Figure 8B:
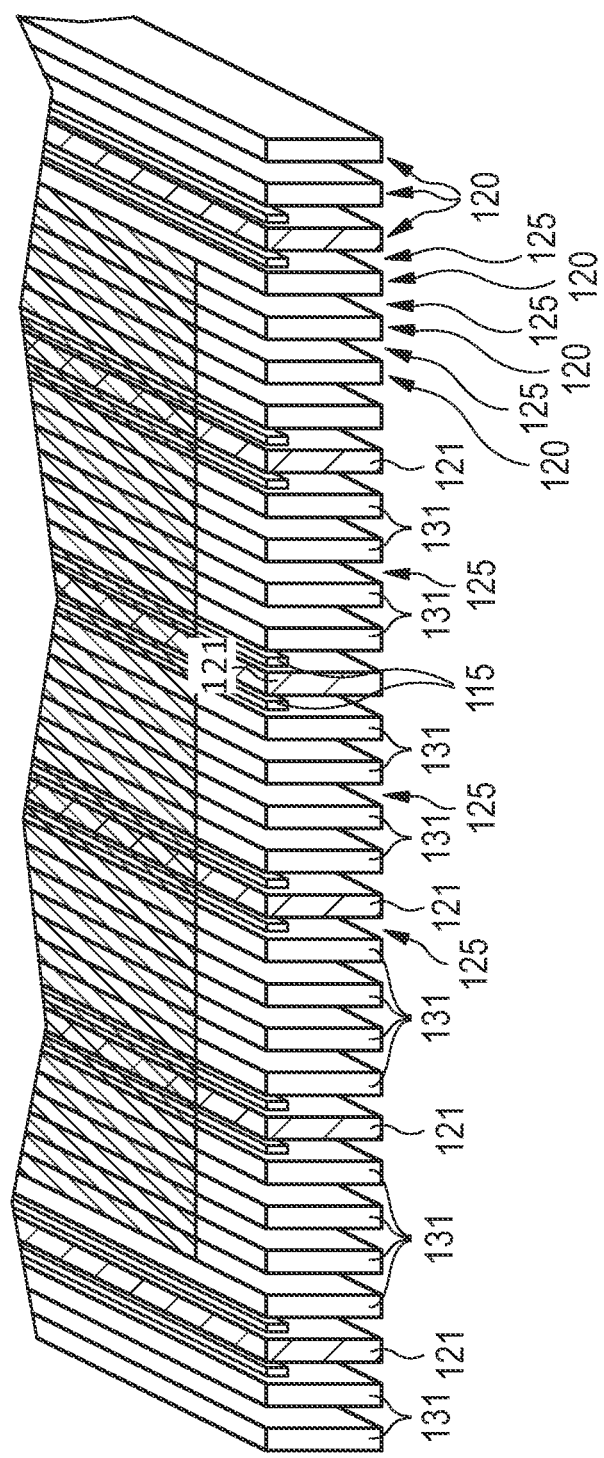
FIG. 8B illustrates an enlarged section of the view of FIG. 8A.

FIGS. 8A and 8B illustrate a portion of a semiconductor device and particularly a non-switchable free-wheeling diode region 1142. The horizontal or lateral extension of the non-switchable free-wheeling diode region 1142 is indicated by dx in a first lateral direction and by dy in a second lateral direction which is also referred to as longitudinal direction as this direction is parallel to the extent of the trenches 120.

According to an embodiment, dy can be at least 5 times of the trench pitch, particularly at least 10 times of the trench pitch. According to an embodiment, dx can be at least 3 times of the trench pitch, particularly at least 5 times of the trench pitch.

The rectangular layer 190, the extension of which correspond to the lateral extension dx and longitudinal extension dy of the non-switchable free-wheeling diode region 1142, illustrates a mask layer which is used to cover the non-switchable free-wheeling diode region 1142 during source region implantation so that no source regions 111 are formed in the non-switchable free-wheeling diode region 1142. The mask layer 190 can also be used during a body implantation process to reduce the body implantation dose relative to the remaining portions of the semiconductor substrate 100. For example, a two-step body implantation can be carried out where the mask layer 190 covers the non-switchable free-wheeling diode region 1142 during one of the two body implantation steps so that the total dose implanted into the non-switchable free-wheeling diode region 1142 is reduced.

A plurality of trenches 120 is illustrated in FIG. 8A. Every $5^{th}$ trench 120 is provided with a gate electrode 121, while all other trenches, i.e, trenches 1 to 4, are provided with a field electrode 131 which is electrically connected with the emitter terminal E and therefore on the same electrical potential as the source regions 111. The gate electrodes 111 are ineffective in the area assumed by the non-switchable free-wheeling diode region 1142, but are effective to form switchable channel regions 151 in the IGBT cell region 1141 and the switchable free-wheeling diode region 1143.

Contact regions or contact trenches, which may be formed by body contact regions 115, are also formed in mesa regions 125, particularly or exclusively adjacent to the trenches 120 that includes gate electrodes 121.

As illustrated in FIGS. 8A and 8B, not all mesa regions 125 are electrically contacted. The mesa regions 125 which are not electrically contacted form so-called dummy cells. Dummy cells can be arranged within any cell region, i.e. within the IGBT cell region 1141, non-switchable free-wheeling diode cell region 1142, and switchable freewheeling diode cell region 1143.

According to a specific embodiment, dx can be about 30 µm and dy can be about 80 µm. Typically, dy is larger than dx since the lateral voltage drop in the longitudinal direction of the trenches 120 (i.e. along dy) is smaller than in the lateral direction (i.e. along dx) perpendicular to the longitudinal extension of the trenches 120. Therefore, a larger minimal distances of the central area of the non-switchable freewheeling diode cell region 1142 is desired.

The snapping-back behavior as illustrated in FIG. 4 has been simulated using a configuration as shown in FIGS. 8A and 8B with dx of about 20 µm for curve 301, dx of about 40 µm for curve 302, and dx of about 55 µm for curve 303. As explained above, when the most remote non-switchable diode cell 142, i.e. the central cell or the central portion of the non-switchable freewheeling diode cell region 1142, is spaced from the nearest switchable diode cell 143 by a sufficiently large minimal distance, the snapping-back behavior can be prevented or at least significantly reduces as shown for curve 302.

The non-switchable freewheeling diode cell region 1142 (i.e. the "metal cell region") is an inactive cell region during forward conductive mode of the semiconductor device, i.e. during the IGBT mode. However, the non-switchable freewheeling diode cell region 1142 contributes to the thermal capacity of the semiconductor device during an avalanche or short-circuiting operation. It is therefore possible to increase the channel width in regions outside of the non-switchable freewheeling diode cell region 1142, particularly in the IGBT cell region 1141, by an amount that corresponds to the area assumed by the non-switchable freewheeling diode cell region 1142. The increased area of the conductive channels (inversion channels) in the IGBT cell region 1141 is thus compensated by the inactive area of the non-switchable freewheeling diode cell region 1142. The total desaturating current of the semiconductor device, or the total dissipated energy during a short-circuiting operation of the semiconductor device can therefore be kept constant.

Figure 7A:
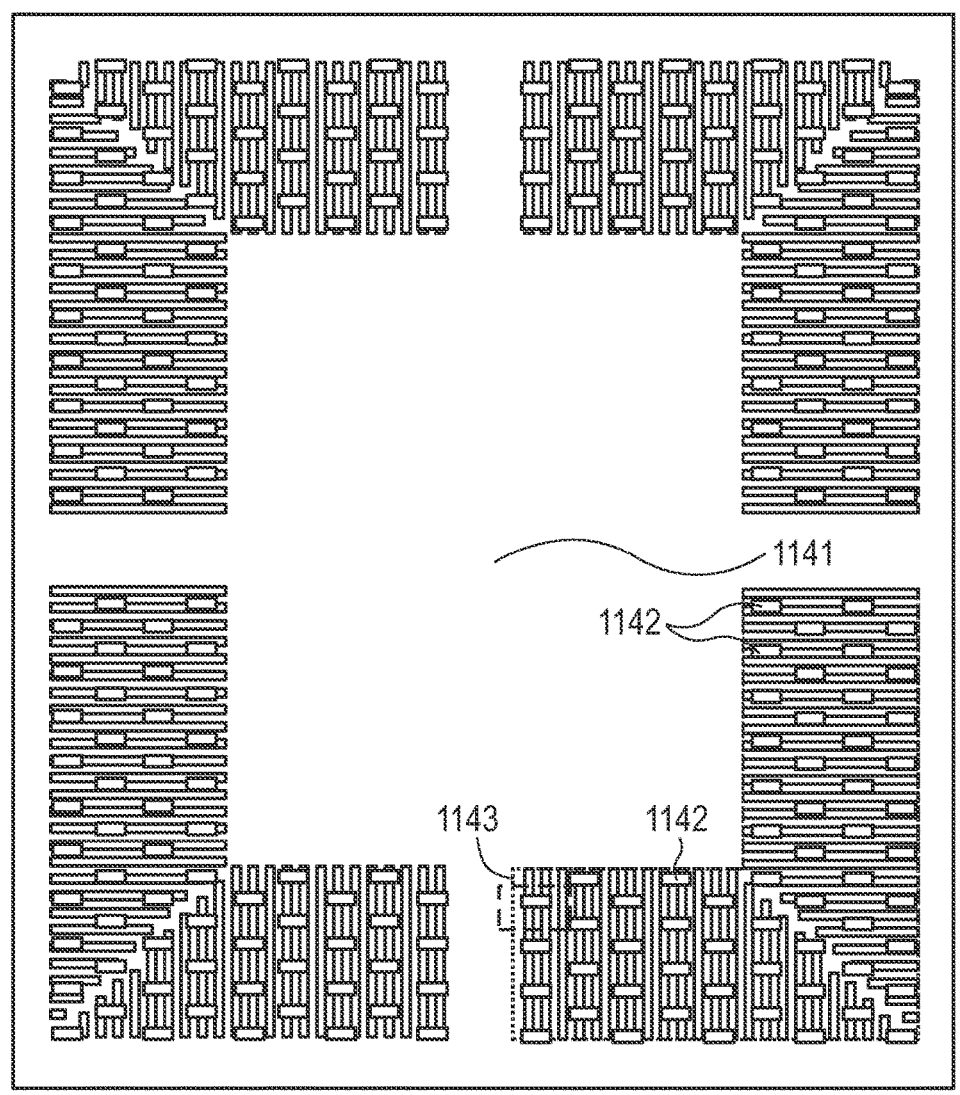
FIG. 7A illustrates a plane view on a semiconductor device having a IGBT cell region, a switchable diode region and a non-switchable diode region, according to an embodiment described herein.

FIGS. 7A and 7B illustrates further examples for the distribution of non-switchable freewheeling diode cell region 1142, the switchable freewheeling diode cell region 1143, and the IGBT cell region 1143. FIG. 7B shows an enlarged view of the portion indicated in FIG. 7A by the dashed rectangular 700.

As shown in FIG. 7A, the IGBT cell region 1143 mainly covers the central area of the semiconductor device and is formed as single region. The switchable freewheeling diode cell region 1143 includes four separate regions which together laterally surrounds the IGBT cell region 1143. One of the four switchable freewheeling diode cell regions 1143 is marked by a dotted line. A plurality of separate non-switchable freewheeling diode cell regions 1142 is formed within each of the switchable freewheeling diode cell regions 1143.

The non-switchable freewheeling diode cell regions 1142 differ from the switchable freewheeling diode cell region 1143 in at least one of a contact scheme or pattern for contacting the respective body and/or source regions, a different source implantation (source regions of different doping concentration) or no source regions, different barrier regions, a reduced doping concentration of the respective body regions and a different trench formation. Specific details regarding the variation of cell parameters are given further below.

The enlarged view in FIG. 7B shows that each of the switchable freewheeling diode cell regions 1143 and non-switchable freewheeling diode cell regions 1142 is formed by a plurality of cells which includes trenches 120 and mesa regions 125 between adjacent trenches 120. The arrangement of the n-doped emitter regions 114 at the second side 102 is marked by "n" while the remaining area is marked with "p" indicating the p-doped emitter regions 116.

The non-switchable freewheeling diode cell regions 1142 are separated from the surrounding switchable freewheeling diode cell region 1143 in one lateral direction by trenches 120 and in another lateral direction perpendicular to the longitudinal extension of the trenches 120 by insulating trenches 127. The insulating trenches 127 are formed in the mesa regions 125 and are filled with an electrically insulating material to improve the electrical separation of the non-switchable freewheeling diode cell regions 1142 from the surrounding switchable freewheeling diode cell region 1143 and to reduce the influence of the switchable freewheeling diode cell region 1143 on the functioning of the non-switchable freewheeling diode cell region 1142.

In view of the above, the semiconductor substrate 100 includes, according to an embodiment, a plurality of trenches 120 and a plurality of mesa regions 125 extending parallel to the plurality of trenches 120, wherein a respective one of the mesa-regions 125 is arranged between and delimited by two adjacent trenches of the plurality of trenches 120. Each of the IGBT cells 141, switchable diode cells 143 and non-switchable diode cells 142 are formed in a respective portion of a trench 120. The non-switchable cell region 1142 is at least partially separated from the IGBT cell region 1141 and/or from the switchable free-wheeling diode region 1143 by at least one insulating trench 127.

The clustered non-switchable diode cells 142, i.e. the non-switchable free-wheeling diode region, can be characterized by variation of a plurality of parameters relative to the switchable diode cells 143. For example, the typically repetitive contact pattern for contacting source regions can be different between non-switchable free-wheeling diode region and the switchable free-wheeling diode region. Furthermore, no contacts to gate electrodes 121 formed in trenches 120 of the non-switchable diode cells 142 present to avoid formation of switchable channel regions.

The purpose is to avoid formation of switchable channel regions, i.e, an ohmic path, through the non-switchable diode cells 142. No active or switchable ohmic channels are thus formed in the non-switchable diode cells 142.

Figure 9:
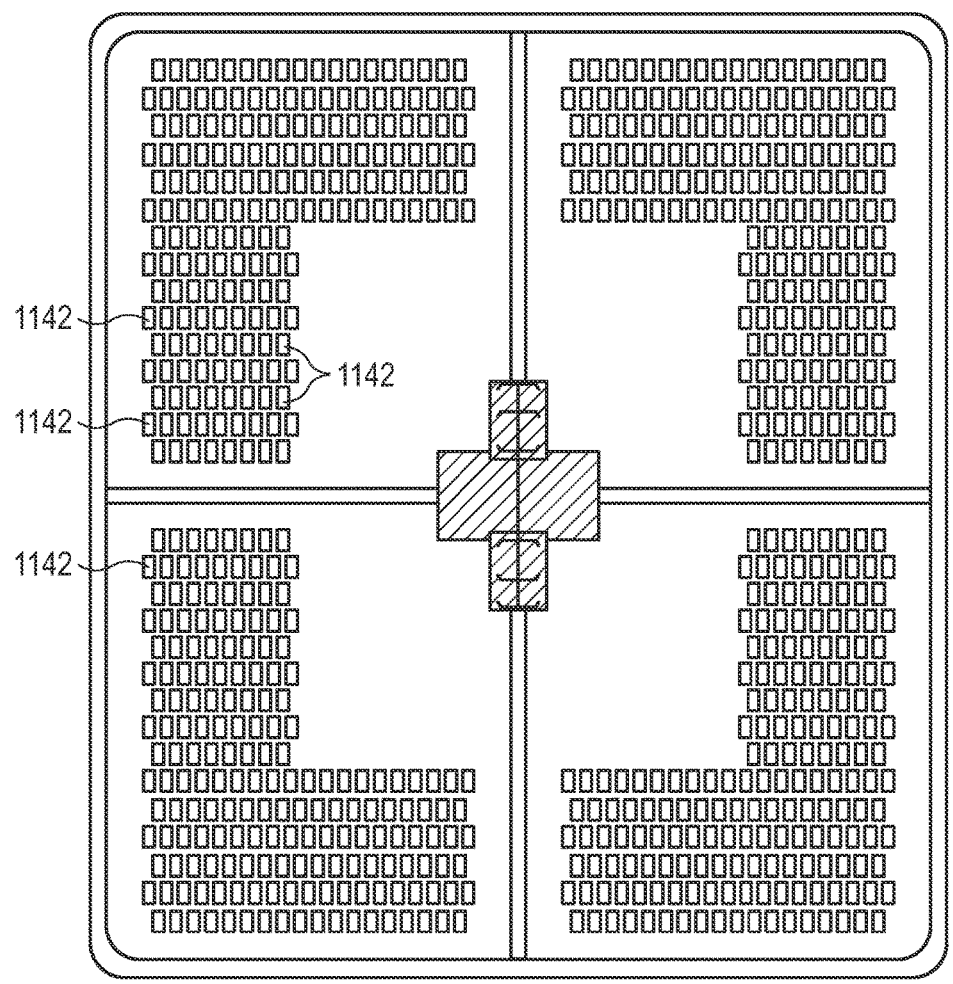
FIG. 9 illustrates a plane view on a semiconductor device having an IGBT cell region, a switchable diode region and a non-switchable diode region, according to an embodiment described herein.

FIG. 9 illustrates another embodiment for the arrangement of the non-switchable free-wheeling diode regions 1142.

FIGS. 10 to 14 illustrate examples for variation of cell parameters to prevent formation of channel within the non-switchable diode cells 142.

FIG. 10 illustrates a cross-sectional view of a non-switchable diode cell 242. A gate electrode 121 is formed in the trench 120 as in any of the switchable diode cells 142. However, electrical contact to the gate electrode 121 is prevented by insulating layer 161. Thus, the gate voltage applied to the gate terminal G, see FIGS. 1A to 1C and 2A to 2C, is not supplied to the gate electrodes 121 of the non-switchable diode cell 242.

The source region 111 and the body region 112 are in electrical connection with the front metallization 171. FIG. 10 thus shows an example where the contact pattern, or contact scheme, for the gate electrodes 121 is different between the non-switchable diode cells and the switchable diode cells while the remaining cell parameters can be the same. It is, however, also possible to additionally vary other cell parameters such as the doping concentration of the body regions 112, see for examples FIGS. 2A to 2C which show that the body regions 112a of the non-switchable diode cells 142a, 142b, 142c, 142d have a lower doping concentration than the body regions 112 of the switchable diode cell 143.

In view of the above, according to an embodiment, at least some or all of the non-switchable diode cells do not comprise gate electrode or an insulated gate electrode.

FIG. 11 illustrate the variation of another cell parameter. The non-switchable diode cell 342 does not include source regions in comparison to the switchable diode cells 142 as shown in FIGS. 1A to 1C and 2A to 2C, for example. The remaining cell parameters are the same for the non-switchable diode cells 342 and the switchable diode cells 143. It is, however, also possible to additionally vary other cell parameters such as the doping concentration of the body regions 112 and/or prevent formation of gate electrodes in the trenches of the non-switchable diode cells 342.

FIG. 11 also show an inter-layer dielectric 162 which electrically insulates the front metallization 171, which forms a source metallization, from the gate metallization 173. The switchable diode cells 143 typically have such a contact scheme or a similar contact scheme and an inter-layer dielectric 162 between the front metallization 171 and the gate metallization 173. It would also be possible that the front metallization 171 is formed above the gate metallization 173.

Although the gate electrodes 121 are electrically connected to the gate terminal G, the applied gate voltage does not form an operable or effective switchable channel region. The location of the switchable channel region is indicated by the vertically running dashed lines parallel to the vertical extension of the gate electrode 121. Even when the applied gate voltage would form there an inversion channel, this channel does not form an effective ohmic connections since no source regions are formed which could provide an electrical connection between the formed inversion channel and the front metallization 171.

In view of the above, according to an embodiment, at least some or all of the non-switchable diode cells do not comprise a source region of a first conductivity type in ohmic connection with the front metallization.

FIG. 12 illustrates further variations of cell parameters. The non-switchable diode cells 342 of FIG. 12 include an n-barrier 118 or a barrier region 118 below the body region 112 and between the body region 112 and the drift region 113 to reduce the anode efficiency of the body region 112. The n-barrier 118 has a higher doping concentration than the weakly n-doped drift region 113.

In view of the above, according to an embodiment, at least some or all of the non-switchable diode cells can include a barrier region 118 of the first conductivity type arranged between the drift region 113 and the body region 112 or below the pn-junction between the drift region 113 and the body region 112 of the respective non-switchable diode cells 142.

Another option to reduce the anode efficiency is the variation of the doping concentration of the body regions 112 as explained further above. Therefore, according to an embodiment, the body region 112 of at least some or all of the non-switchable diode cells have a doping concentration which is lower than the doping concentration of the body regions 112 of the switchable diode cells 143. FIG. 14 illustrates a variation of the anode efficiency.

According to a further embodiment, at least some or all of the non-switchable diode cells are provided with lifetime-controlling dopants and/or crystal defects to reduce the lifetime of charge carriers in comparison to the lifetime of charge carriers in the switchable diode cells 143. For example, lifetime-controlling dopants are Pt or Au. Crystal defects for controlling the lifetime of charge carriers can be generated by providing a mask which leaves only regions of the non-switchable diode cells uncovered and then implanting non-doping impurities such as Ar- or Si-ions.

According to an embodiment, at least two of the non-switchable diode cells of the same non-switchable free-wheeling diode region can differ from each other in at least one of the doping concentration of the respective body regions and the concentration of lifetime-controlling dopants. The variations of the doping concentration can be step-wise or gradually.

According to an embodiment, each of the non-switchable diode cells of the first non-switchable free-wheeling diode region has a higher emitter efficiency than each of the non-switchable diode cells of the second non-switchable free-wheeling cell region. It is thus possible to provide non-switchable free The variation of the anode efficiency and the lifetime-control can also be used together and/or in combination with other variations of cell parameters.

According to a further embodiment, at least one non-switchable diode cell 442b of the non-switchable free-wheeling diode region has a barrier region 118, 118a and at least another non-switchable diode cell 442a of the non-switchable free-wheeling diode region has no barrier region. In a further variation, either in combination or alternatively, at least one non-switchable diode cell 442c of the non-switchable free-wheeling diode region has a barrier region 118b with a different doping concentration than the barrier region 118a of the non-switchable diode cell 442b. Barrier region 118a can have a lower doping concentration than barrier region 118b to form barrier regions of different doping concentrations. The variation of the doping concentration can be step-wise or gradually.

FIG. 12 also illustrates a buffer or field stop layer 117 formed between the drift region 113 and the respective emitter regions 114 and 116.

It is also possible to additionally vary other cell parameters such as the doping concentration of the body regions 112 and/or prevent formation of gate electrodes in the trenches of the non-switchable diode cells 442 and/or avoid formation of source regions non-switchable diode cells 442.

FIG. 13 illustrates a further variation of cell parameter even between adjacent non-switchable diode cells 542a and 542b. The non-switchable diode cell 542b does not have source regions 111 and body contact regions 115 as non-switchable diode cells 542a. To prevent formation of an operable switchable channel region, the gate electrodes 121 are electrically insulated from the gate metallization 173 (not shown) by the insulating layer 161.

Furthermore, as illustrated in FIG. 13, at least some of the non-switchable diode cells 542a include a body contact region 115 of the second conductivity embedded in the body region 112 and having a higher doping level than the body region 112, wherein the body contact region 115 forms an ohmic connection with the front metallization 171.

FIG. 14 illustrates further variations of cell parameters. According to an embodiment, the non-switchable free-wheeling diode region 1142b includes first non-switchable diode cells 642a and second non-switchable diode cells 642b, wherein the electrical connection of the first non-switchable diode cells 642a to the front metallization 171 is different to the electrical connection of the second non-switchable diode cells 642b to the front metallization 171. For example, the contact area between the front metallization 171 and the respective body regions of the first non-switchable diode cells 642a and second non-switchable diode cells 642b within the same non-switchable free-wheeling diode region 1142b can be different. This allows optimizing the behavior of the non-switchable free-wheeling diode region 1142b with regard to both the emitter efficiency (small contact area) and dynamic avalanche during switching-off commutation (large contact area). Alternatively, or in addition to that, body contact regions 115 can be selectively formed.

The contact area between the front metallization 117 and the respective body regions 112 can also be varied between different and spaced apart non-switchable free-wheeling diode regions 1142a and 1142b.

As also illustrate in FIG. 14, according to an embodiment, at least a portion of a first non-switchable free-wheeling diode region 1142a is arranged above the emitter region 114 of the second conductivity type formed at the second side of the semiconductor substrate 100, and at least a portion of or all of a second non-switchable free-wheeling diode region 1142b is arranged above the emitter region 116 of the first conductivity type formed at the second side of the semiconductor substrate 100. A portion of the non-switchable free-wheeling diode region can be formed above the p-type emitter region 114 above which also the IGBT cell region is exclusively formed.

The non-switchable diode cells 642c of the non-switchable free-wheeling diode region 1142a, which are arranged above the p-doped emitter region 114, can be provided with a high emitter efficiency, which can be higher than the emitter efficiency of non-switchable diode cells 642a, 642 of the same or different non-switchable free-wheeling diode regions 1142b which are arranged above the n-doped emitter region 116. The increased emitter efficiency allows adjustment of the diode commutation after desaturating pulses. Desaturating pulses are applied during the above mentioned transit mode where the conductive channels 151 are rendered conductive for a short period.

In view of the above, according to an embodiment, a semiconductor device includes a semiconductor substrate 100 having a first side 101 and a second side 102; a front metallization on a first side of the semiconductor substrate 100; and a back metallization on a second side of the semiconductor substrate 100. The semiconductor device further includes at least one emitter region 114 of the second conductivity type formed at the second side 102 of the semiconductor substrate 100 and at least one emitter region 116 of the first conductivity type at the second side 102 of the semiconductor substrate 100. The semiconductor device can optionally include a plurality of IGBT cells 141 integrated in the semiconductor substrate 100 and forming at least one IGBT cell region, each of the IGBT cells 141 comprising an operable switchable channel region 151 for providing an ohmic connection between the front metallization and a drift region 113 of the semiconductor substrate 100, wherein all IGBT cells 141 are formed above the emitter region 114 of the second conductivity type. The semiconductor device includes a plurality of non-switchable diode cells 142 integrated in the semiconductor substrate 100 and forming one or a plurality of non-switchable free-wheeling diode regions, wherein at least a portion of the one non-switchable free-wheeling diode region or at least some of the plurality of non-switchable free-wheeling diode regions is/are arranged above the emitter region 114 of the second conductivity type, and wherein at least another portion of the one non-switchable free-wheeling diode region or some of the plurality of non-switchable free-wheeling diode regions is/are arranged above the emitter region 116 of the first conductivity type.

The portion of the non-switchable free-wheeling diode region arrange above the emitter region of the second conductivity type, in the embodiment of FIG. 14 the non-switchable free-wheeling diode region 1142a above the p-doped emitter region 114, contributes to the diode commutation after desaturation. The portion of the non-switchable free-wheeling diode region arrange above the emitter region of the second conductivity type can be provided with a higher emitter efficiency than portions of the non-switchable free-wheeling diode region or other non-switchable free-wheeling diode regions which are arrange above the emitter region of the first conductivity type. The different emitter efficiency can be adjusted by, for example, variation of the doping concentration of the respective body regions 112 or the contact area between the respective body regions 112 and the front metallization 117 as described above.

FIG. 14 also illustrates that dummy cell 644 can be integrated in the non-switchable free-wheeling diode region 1142a or in any other non-switchable free-wheeling diode region, switchable free-wheeling diode region or IGBT cell region.

The non-switchable free-wheeling diode regions and the switchable free-wheeling diode regions, or their respective diode cells, not only differ in the way they function but can also be specifically adapted to be optimized for their purpose.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of operating an insulated gate bipolar transistor (IGBT), the method comprising:
providing an IGBT comprising a gate terminal, an emitter terminal and a collector terminal, and a plurality of IGBT cells, a plurality of switchable diode cells, and a plurality of non-switchable diode cells integrated in a semiconductor substrate, wherein each of the IGBT cells and switchable diode cells comprises an operable switchable channel region;
operating the IGBT in a reverse conductive mode in which the IGBT cells are in a non-conductive mode and the switchable diode cells and the non-switchable diode cells are in a bipolar mode; and
bringing the IGBT from the reverse conductive mode to a transit mode in which at least some of the non-switchable diode cells are still in the bipolar mode, the IGBT cells are in the non-conductive mode, and the switchable diode cells are in a unipolar mode, by applying a gate voltage having an absolute value larger than a gate threshold voltage to the gate terminal.

2. The method of claim 1, further comprising:
bringing the IGBT from the transit mode to a forward blocking mode in which the non-switchable diode cells, the switchable diode cells and the IGBT cells are in the non-conductive mode, by applying a gate voltage having an absolute value less than the gate threshold voltage to the gate terminal, or by applying no gate voltage.

3. The method of claim 1, further comprising:
impressing a reverse current between the collector terminal and the emitter terminal during the reverse conductive mode and the transit mode, so that a reverse voltage appears between the collector terminal and the emitter terminal during the reverse conductive mode and the transit mode.

4. The method of claim 3, further comprising:
applying a forward voltage having an opposite sign to the reverse voltage between the collector terminal and the emitter terminal during a forward blocking mode.

5. The method of claim 1, wherein the operable switchable channel region of each IGBT cell provides an ohmic connection between a front metallization and a drift region of the semiconductor substrate, the method further comprising controlling each ohmic connection through the gate voltage applied to the gate terminal.

6. The method of claim 1, wherein the operable switchable channel region of each switchable diode cell provides a controllable ohmic connection between a front metallization and a back metallization.

7. The method of claim 1, wherein the plurality of non-switchable diode cells forms at least one non-switchable free-wheeling diode region, and wherein each of the non-switchable diode cells comprises a pn-junction.

8. The method of claim 7, wherein the at least one non-switchable free-wheeling diode region comprises first non-switchable diode cells and second non-switchable diode cells, and wherein an electrical connection of the first non-switchable diode cells to a front metallization is different than an electrical connection of the second non-switchable diode cells to the front metallization.

9. The method of claim 7, wherein at least two of the non-switchable diode cells of the at least one non-switchable free-wheeling diode region differ from each other in at least one of body region doping concentration and lifetime-controlling dopant concentration.

10. The method of claim 1, wherein each non-switchable diode cell comprises a body region and a drift region of different conductivity types so that a pn-junction occurs between the body region and the drift region, the method further comprising applying in the reverse conductive mode a voltage difference over the pn-junction between the body region and the drift region which is equal to or larger than a forward voltage drop of the pn-junction so that a bipolar current flows through the non-switchable diode cells in the bipolar mode.

11. The method of claim 10, wherein in the forward conductive mode, the pn-junction between the body region and the drift region of each non-switchable diode cell blocks electron flow through the non-switchable diode cells.

12. The method of claim 1, wherein operating the IGBT in the reverse conductive mode comprises:
switching the switchable diode cells from the unipolar current mode to the bipolar current mode, by reducing the gate voltage applied to the gate terminal to below the gate threshold voltage.

13. The method of claim 1, wherein operating the IGBT in the reverse conductive mode comprises:
switching the switchable diode cells from the bipolar current mode to the unipolar current mode, by increasing the gate voltage applied to the gate terminal to above the gate threshold voltage.

14. The method of claim 1, wherein operating the IGBT in the reverse conductive mode comprises:
driving a negative collector-emitter current in the IGBT which results in a first negative collector-emitter voltage, so that the only available current flow in the IGBT is unipolar current through the switchable cells;
decreasing the collector-emitter current so that the collector-emitter current becomes more negative and which results in a second negative collector-emitter voltage which is more negative than the first negative collector-emitter voltage, so that a bipolar current flows through some but not all of the non-switchable diode cells; and further decreasing the collector-emitter current so that the collector-emitter current becomes even more negative and which results in a third negative collector-emitter voltage which is more negative than the second negative collector-emitter voltage, so that a bipolar current flows through all of the non-switchable diode cells except the non-switchable diode cell closest to the switchable diode cells.

15. The method of claim 1, wherein each of the switchable diode cells and each of the IGBT cells comprises a source region of a first conductivity type in ohmic connection with the front metallization, a drift region of the first conductivity type, a body region of a second conductivity type arranged between the source region and the drift region and forming respective pn-junctions with the source region and the drift region, and a gate electrode arranged adjacent to and electrically insulated from the body region so as to define the respective operable switchable channel region of each of the switchable diode cells and the IGBT cells, and wherein each of the non-switchable diode cells comprises a drift region of the first conductivity type and a body region of the second conductivity type which forms a pn-junction with the drift region, the body region being in ohmic connection with the front metallization.

16. The method of claim 15, wherein at least some of the non-switchable diode cells do not comprise a source region of a first conductivity type in ohmic connection with the front metallization.

17. The method of claim 15, wherein at least some of the non-switchable diode cells do not comprise a gate electrode or an insulated gate electrode.

18. The method of claim 1, wherein the semiconductor substrate comprises a plurality of trenches and a plurality of mesa regions extending parallel to the plurality of trenches, wherein a respective one of the mesa-regions is arranged between and delimited by two adjacent trenches of the plurality of trenches, wherein each of the IGBT cells, switchable diode cells and non-switchable diode cells are formed in a respective portion of a trench, and wherein the at least one non-switchable free-wheeling diode region is at least partially separated from the at least one IGBT cell region and/or from the at least one switchable free-wheeling diode region by at least one insulating trench.

19. The method of claim 1, wherein the semiconductor substrate comprises a plurality of spaced apart non-switchable free-wheeling diode regions each comprising a plurality of non-switchable diode cells, and wherein a lateral distribution of the non-switchable free-wheeling diode regions is inhomogeneous.

20. The method of claim 1, wherein at least one of the non-switchable diode cells has a barrier region and at least another one of the non-switchable diode cells has no barrier region or a barrier region with a different doping concentration.

* * * * *